United States Patent
Xie et al.

(10) Patent No.: US 9,478,661 B1
(45) Date of Patent: Oct. 25, 2016

(54) SEMICONDUCTOR DEVICE STRUCTURES WITH SELF-ALIGNED FIN STRUCTURE(S) AND FABRICATION METHODS THEREOF

(71) Applicant: GLOBALFOUNDRIES Inc., Grand Cayman (KY)

(72) Inventors: Ruilong Xie, Schenectady, NY (US); Chanro Park, Clifton Park, NY (US); Hoon Kim, Clifton Park, NY (US); Min Gyu Sung, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/696,954

(22) Filed: Apr. 27, 2015

(51) Int. Cl.
*H01L 21/308* (2006.01)
*H01L 29/78* (2006.01)
*H01L 29/66* (2006.01)
*H01L 21/768* (2006.01)
*H01L 21/02* (2006.01)

(52) U.S. Cl.
CPC ....... *H01L 29/785* (2013.01); *H01L 21/02603* (2013.01); *H01L 21/3081* (2013.01); *H01L 21/76897* (2013.01); *H01L 29/6656* (2013.01); *H01L 29/66795* (2013.01)

(58) Field of Classification Search
CPC ............. H01L 29/66795; H01L 21/3086; H01L 21/7624
See application file for complete search history.

(56) References Cited

U.S. PATENT DOCUMENTS

| 2008/0308848 A1* | 12/2008 | Inaba | G11C 11/412 257/255 |
| 2013/0244392 A1* | 9/2013 | Oh | H01L 29/66477 438/299 |
| 2014/0346605 A1* | 11/2014 | Zeitzoff | H01L 27/0886 257/368 |

* cited by examiner

*Primary Examiner* — Thomas L Dickey
(74) *Attorney, Agent, or Firm* — Heslin Rothenberg Farley & Mesiti P.C.; Nicholas Mesiti, Esq.

(57) ABSTRACT

Semiconductor device structures having fin structure(s) and fabrication methods thereof are presented. The methods include: providing a first mask above a substrate structure and a second mask above the first mask and the substrate structure; removing portions of the first mask not underlying the second mask and selectively etching the substrate structure using the second mask to form at least one cavity therein; providing a third mask over portions of the substrate structure not underlying the second mask and removing the second mask; and selectively etching the substrate structure using remaining portions of the first mask and the third mask to the form fin structure(s) of the semiconductor device structure, where the fin structure(s) is self-aligned with the at least one cavity in the substrate structure. For example, the semiconductor device structure can be a fin-type transistor structure, and the method can include forming a source/drain region within a cavity.

16 Claims, 31 Drawing Sheets

SEMICONDUCTOR DEVICE STRUCTURES WITH SELF-ALIGNED FIN STRUCTURE(S) AND FABRICATION METHODS THEREOF

FIELD OF THE INVENTION

The present invention relates to semiconductor devices and to methods of fabricating semiconductor devices, and more particularly to semiconductor device structures with self-aligned fin structures and fabrication methods thereof.

BACKGROUND OF THE INVENTION

Consumer demand continues to drive the semiconductor industry to seek semiconductor device technologies that provide integrated circuits with enhanced performance and increased density. Three-dimensional semiconductor device technologies have been proposed and developed to meet such demand. For example, fin-type semiconductor devices, such as fin-type field-effect transistors (FinFETs) can include three-dimensional fin structures extending from a semiconductor substrate, and offer an alternative to planar transistors in advanced complementary metal oxide semiconductor (CMOS) technology nodes. In particular, the three-dimensional fin structures can include active semiconductor device regions, allowing for improved short-channel effect immunity and enhanced device current density.

However, fabrication of three-dimensional semiconductor device structures can be quite challenging, and using standard fabrication techniques can lead to device failures, increasing fabrication cost. Therefore, a need exists for fabrication processes that are compatible with three-dimensional semiconductor device structures.

BRIEF SUMMARY

The shortcomings of the prior art are overcome, and additional advantages are provided, through the provision, in one aspect, of a method for fabricating semiconductor device structures having at least one fin structure. The method includes: providing a first mask above a substrate structure and a second mask above the first mask and the substrate structure; removing portions of the first mask not underlying the second mask and selectively etching the substrate structure using the second mask to form at least one cavity therein; providing a third mask over portions of the substrate structure not underlying the second mask and removing the second mask; and selectively etching the substrate structure using the remaining portions of the first mask and the third mask to form the at least one fin structure of the semiconductor device structure, wherein the at least one fin structure is self-aligned with the at least one cavity in the substrate structure.

In another aspect, a semiconductor device structure is presented. The semiconductor device structure is disposed at least partially within a substrate structure, and includes: at least one fin structure, the at least one fin structure being self-aligned with at least one cavity of the substrate structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
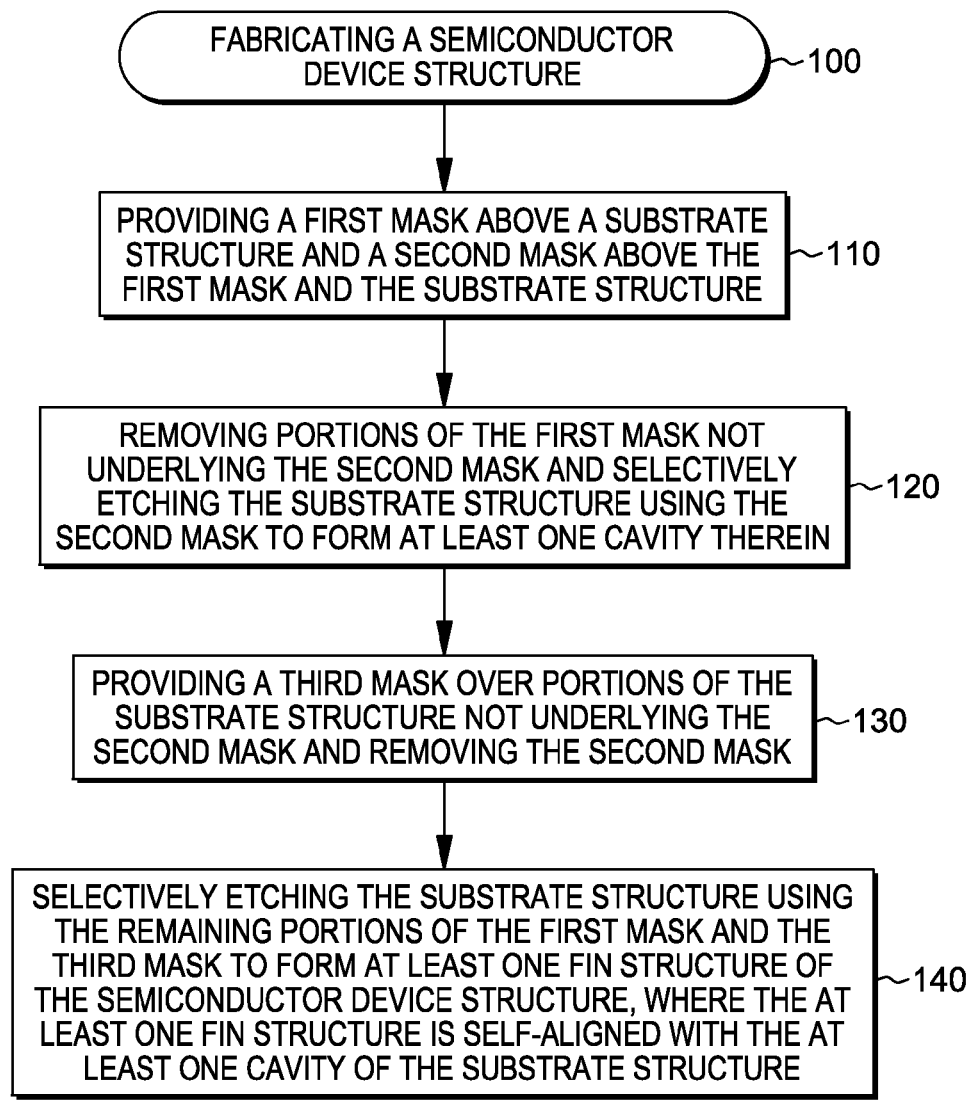
FIG. 1 depicts embodiments of processes for fabricating semiconductor device structures, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, methods for fabricating semiconductor device structures with self-aligned fin structures. As the semiconductor industry pursues three-dimensional semiconductor device technologies, such as fin-type field-effect transistors (FinFETs), conventional fabrication processes, initially designed for fabricating planar semiconductor devices, may not be fully compatible with fabrication of three-dimensional structures. For example, processes such as replacement metal gate processes make use of sacrificial structures which are formed and later removed and replaced with final structures. Deposition and removal processes of such structures can be challenging when, for example, sacrificial structures are in contact with and wrap around fin structures.

In particular, semiconductor device structures having tall (e.g., 100 or more nanometers), closely spaced fin structures, can pose fabrication problems with standard deposition, etching, and other processes. For instance, the high aspect ratio of such structures can inhibit fabrication chemicals and gases from flowing to or reaching desired regions during fabrication processing. In addition, structural stability of such fin structures can be an issue, leading to potential structural collapse during fabrication.

Advantageously, the present disclosure overcomes such limitations by providing novel methods for fabricating semiconductor device structures with self-aligned fin structures. For example, the present disclosure allows, in part, for the late formation of fin structures, which can be channel regions of transistors, precisely between source and drain regions of the transistors, to sub-photolithographic precision. For example, late formation can mean that the fin structures are formed after source/drain regions and/or gate structure formation processing.

Generally stated, provided herein, in one aspect, is a semiconductor device structure. The semiconductor device structure is disposed at least partially within a substrate structure, and includes: at least one fin structure, the at least one fin structure being self-aligned with at least one cavity of the substrate structure. In one embodiment, the semiconductor device structure further includes spacers disposed above the substrate structure and adjacent to the at least one fin structure, where the spacers are self-aligned with the at least one cavity.

Reference is made below to the drawings, which are not drawn to scale for ease of understanding, wherein the same reference numbers used throughout different figures designate the same or similar components.

FIG. 1 depicts embodiments of processes for fabricating semiconductor device structures having at least one fin structure, in accordance with one or more aspects of the present invention. For instance, a method includes fabricating a semiconductor device structure 100. In such a case, the fabricating can include: providing a first mask above a substrate structure and a second mask above the first mask and the substrate structure 110; removing portions of the first mask not underlying the second mask and selectively etching the substrate structure using the second mask to form at least one cavity therein 120; providing a third mask over portions of the substrate structure not underlying the second mask and removing the second mask 130; and selectively etching the substrate structure using remaining portions of the first mask and the third mask to form the at least one fin structure of the semiconductor device structure, wherein the at least one fin structure is self-aligned with the at least one cavity in the substrate structure 140. For example, the masks can be hard masks. In one embodiment, these hard masks may be formed using photolithographic patterning and masking steps, but all subsequent processing steps are self-aligned or previously memorized and will not require the use of photolithographic patterning and masking.

In one embodiment, the method further includes forming a semiconductor region of the semiconductor device structure within the at least one cavity in the substrate structure. In such a case, in one example, the method includes forming the semiconductor region of the semiconductor device structure before forming the at least one fin structure thereof. In another example, the providing 130 includes providing the third mask over the semiconductor region of the semiconductor device structure.

In another embodiment, one end of the at least one fin structure is aligned with an edge of at least one cavity in the substrate structure. In a further embodiment, the method further includes forming a contact structure of the semiconductor device structure at least partially surrounding the at least one fin structure. For example, the contact structure can be a gate structure of a transistor.

In one embodiment, the method further includes providing an isolation layer between the second mask and the first mask. For example, the isolation layer can be used to form spacers in a subsequent processing step as described herein. In such a case, in one example, the method further includes providing a fourth mask coplanar with and adjacent to portions of the second mask; and selectively etching the substrate structure using the remaining portions of the first mask, the third mask, and the fourth mask to form spacers concurrent with forming the at least one fin structure, wherein the spacers are self-aligned with the at least one cavity. In another example, forming the at least one fin structure includes etching the isolation layer to form spacers above the at least one fin structure and adjacent to the at least one cavity. In a further example, the method further includes providing a trench isolation material on at least one side of the at least one cavity, wherein the trench isolation material and the isolation layer comprise different materials having different etch properties.

In another embodiment, the method further includes providing the second mask with at least one rectangular segment and the first mask with multiple rectangular segments, wherein the multiple rectangular segments of the first mask are spaced apart and are substantially perpendicular to the at least one rectangular segment of the second mask.

In a further embodiment, the method further includes providing a substrate structure comprising a semiconductor layer over an isolation layer. In such a case, in one example, providing the substrate structure with the isolation layer comprises modifying a material layer of the substrate structure to form the isolation layer thereof. In another example, providing the substrate structure with the isolation layer comprises implanting impurities within lower portions of the at least one fin structure. In another example, providing the substrate structure with the isolation layer comprises implanting impurities within the substrate structure and below the at least one fin structure. In a further example, the method comprises providing the substrate structure with the isolation layer after forming the at least one fin structure.

In one embodiment, the method further includes separating upper portions of the at least one fin structure from the substrate structure to form at least one nanowire of the semiconductor device structure. In another embodiment, the method further includes forming a contact structure of the semiconductor device structure surrounding the at least one nanowire.

In a further embodiment, the semiconductor device structure is a fin-type transistor, and the method further includes forming at least one of a source region or a drain region of the fin-type transistor within the at least one cavity in the substrate structure, wherein the at least one source region or drain region of the fin-type transistor is self-aligned with the at least one fin structure thereof. In such a case, for example, the method can further include forming a gate contact structure of the fin-type transistor at least partially surrounding the at least one fin structure.

Figure 2:
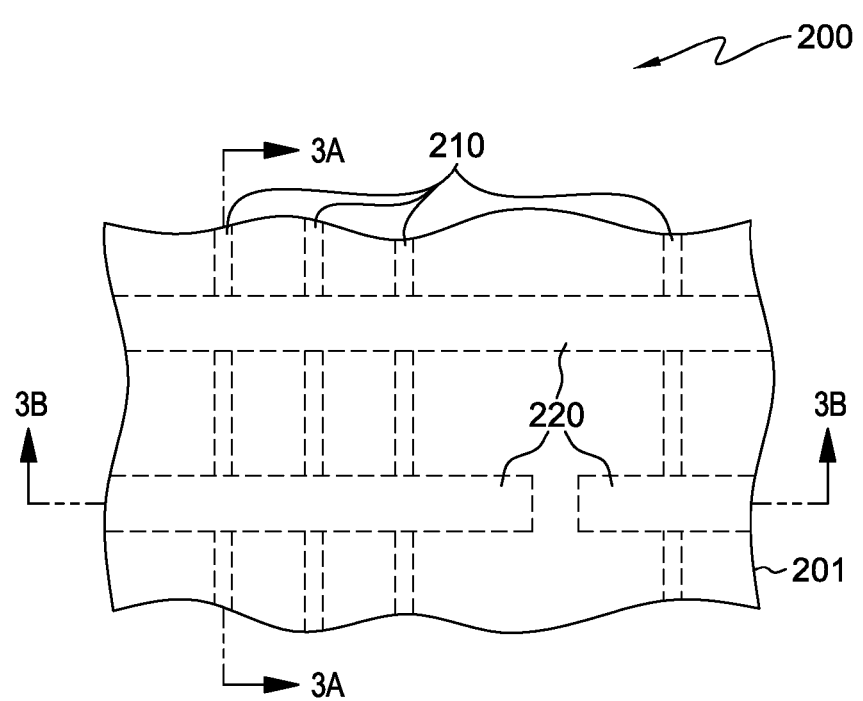
FIG. 2 is a plan view of a structure found in semiconductor device fabrication, in accordance with one or more aspects of the present invention.

FIG. 2 is a plan view of an intermediate structure 200 found in semiconductor device fabrication, in accordance with one or more aspects of the present invention.

By way of explanation, fabrication of three-dimensional semiconductor device structures can be quite challenging in advanced technology nodes, because of technological limitations in fabricating closely spaced devices. In addition, certain photolithographic techniques have limited resolution, and incur a margin of error, leading to difficulties in aligning circuit structures. For example, channel regions of transistor devices must be precisely aligned between source regions and drain regions thereof. Therefore, simply patterning and forming source/drain regions, followed by patterning and forming channel regions can lead to an accumulation of margins of errors, leading to device failure and yield loss. Further, fin-type devices, which include a fin structure extending from a substrate structure, impose additional challenges.

In addition, structure 200 can include an entire wafer used in the fabrication of integrated circuits which can include thousands, millions, billions, or more semiconductor devices, such as transistors. Subsequent to fabrication processing, structure 200 can be diced into individual dies or integrated circuits (i.e., chips), and packaged for use in electronic devices. The techniques described herein can be applied across an entire wafer or a portion thereof.

Advantageously, the present disclosure, in part, makes use of multiple masks that are used together to form three-dimensional device structures such as source/drain regions, channel regions, and/or contact regions of semiconductor devices.

In the illustrated embodiment, structure 200 includes a substrate structure 201. FIG. 2 depicts a first mask region 210 and a second mask region 220 of structure 200, within which a first mask and a second mask, respectively, are to be formed, as detailed below. The formed masks can be used to etch portions of structure 200, such as substrate structure 201, which are not covered by the masks. In a direct masking and etching process, exposed portions of a structure are etched and covered portions thereof are protected, allowing for transfer of a pattern to the underlying structure.

Figure 3A:
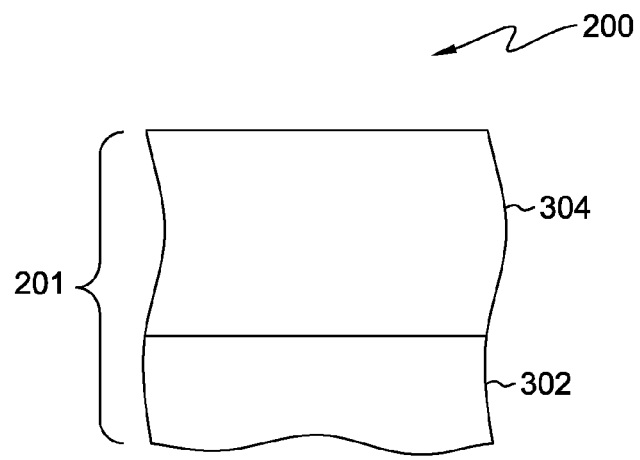
FIGS. 3A & 3B are cross-sectional elevational views of the structure of FIG. 2 taken along lines 3A-3A and 3B-3B thereof, respectively, in accordance with one or more aspects of the present invention.
Figure 3B:
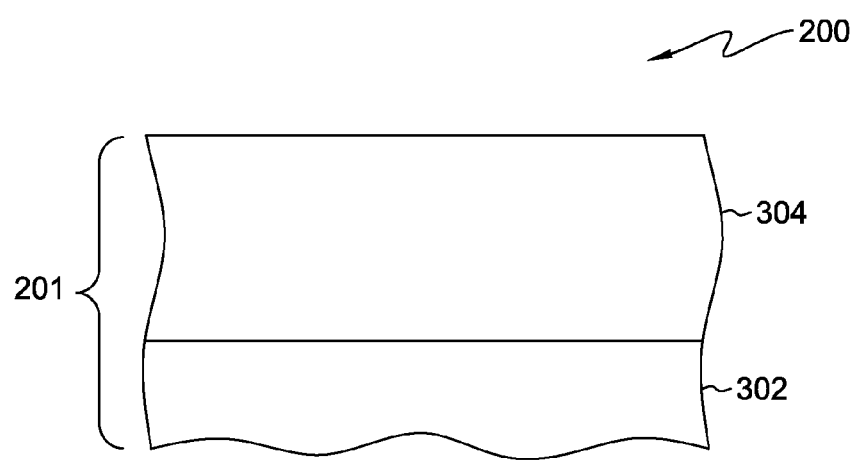

FIGS. 3A & 3B are cross-sectional elevational views of structure 200, taken along lines 3A-3A and 3B-3B of FIG. 2, respectively, in accordance with one or more aspects of the present invention. In one embodiment, substrate structure 201 includes a semiconductor layer 304 disposed over an isolation layer 302.

In one embodiment, substrate structure 201 can be a bulk semiconductor material such as a bulk silicon wafer. In another embodiment, substrate structure 201 can include silicon (Si), single crystal Si, polycrystalline Si, amorphous Si, Si-on-nothing (SON), Si-on-insulator (SOI), or Si-on-replacement insulator (SRI). In a further embodiment, substrate structure 201 can be n-type or p-type doped. In one particular example, substrate structure 201 can have a thickness of approximately 600-900 micrometers.

Figure 4A:
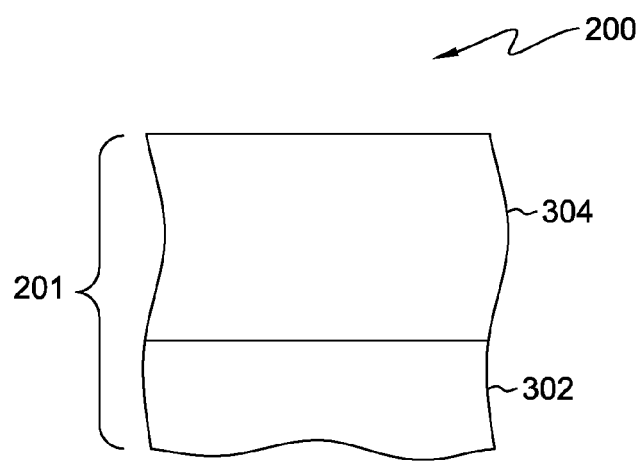
FIGS. 4A & 4B depict the structure of FIGS. 3A & 3B after providing trench isolation within a substrate structure thereof, in accordance with one or more aspects of the present invention.
Figure 4B:
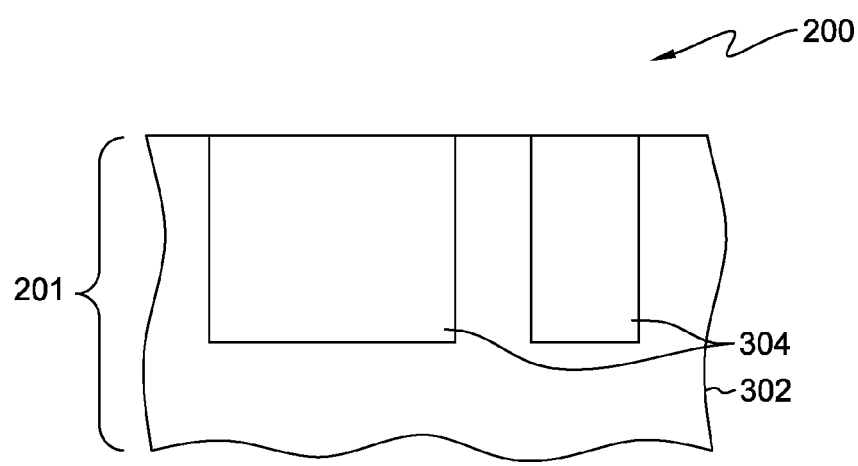

FIGS. 4A & 4B depict structure 200 after providing trench isolation within substrate structure 201, in accordance with one or more aspects of the present invention. Trench isolation can be used to separate different portions of semiconductor layer 304 which will contain different devices. For example, with reference to FIG. 4B, trench isolation enables separate active regions including portions of semiconductor layer 304 on the left and right sides. In one example, each active region can include a variety of semiconductor devices that can be electrically connected together, for example, in series.

Figure 5A:
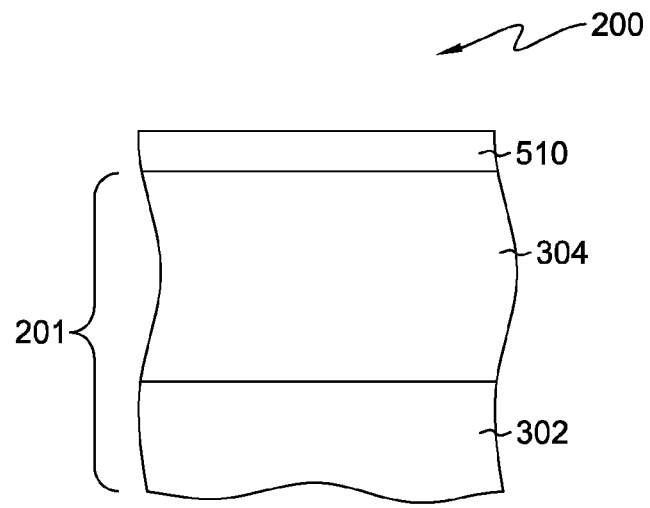
FIGS. 5A & 5B depict the structure of FIGS. 4A & 4B after providing a first mask above the substrate structure thereof, in accordance with one or more aspects of the present invention.
Figure 5B:
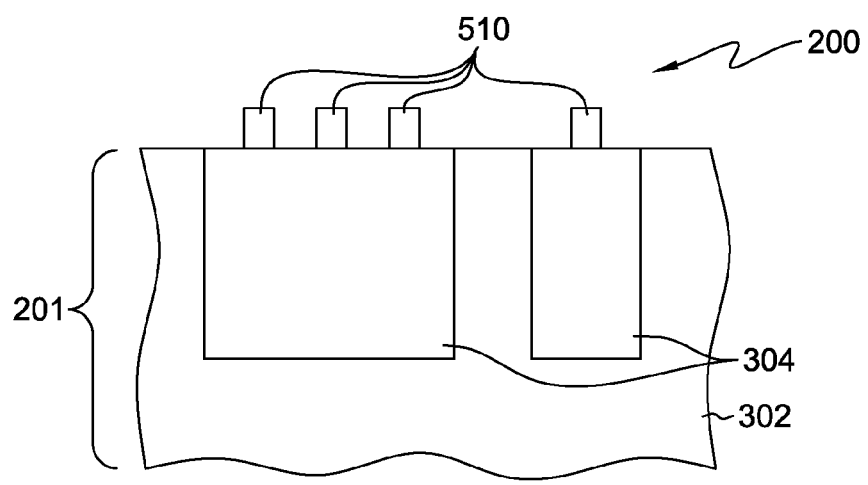

FIGS. 5A & 5B depict structure 200 after providing a first mask 510 above substrate structure 201, in accordance with one or more aspects of the present invention. In one example, first mask 510 can be a hard mask, and can include a material, such as a nitride material, e.g., silicon nitride, or $Al_2O_3$ or $HfO_2$. In one example, first mask 510 can include a pattern of material having numerous solid portions and openings, representing a pattern that can be transferred to the material of structure 200 underlying first mask 510 in a subsequent processing step. In one example, first mask 510 can be formed using photolithographic patterning and etching. In another example, a uniform layer of hard mask material can first be deposited over structure 200, and a photolithographic patterning and etching process can be used to transfer a pattern into the hard mask material to form first mask 510. In various embodiments, different chemical compositions of material can be used to form first mask 510, so that selective etching can be employed. In such a case, etch chemistry may be chosen so that exposed portions of structure 200 (e.g., portions not underlying the material of first mask 510) are etched, and protected or covered portions of structure 200 (e.g., portions underlying the material of first mask 510) are not etched.

As can be understood, the preceding description relates to a direct masking and etching process. An inverse process can be used in which an inverse mask material is used with an inverted pattern, and some etching steps can be modified appropriately to allow transfer of the inverse pattern of the mask.

In the embodiment of FIG. 5B, first mask 510 includes several substantially parallel rectangular portions, which are spaced as required for a given integrated circuit design.

Figure 6A:
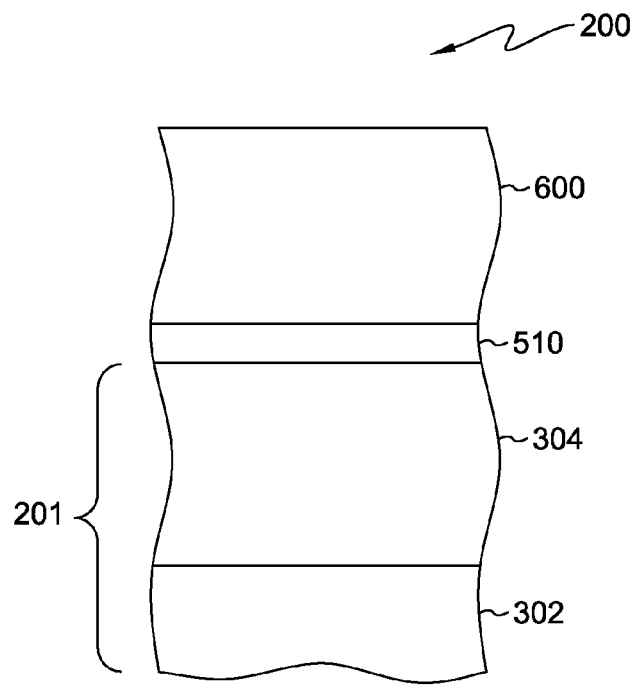
FIGS. 6A & 6B depict the structure of FIGS. 5A & 5B after providing an isolation layer above the first mask and the substrate structure thereof, in accordance with one or more aspects of the present invention.
Figure 6B:
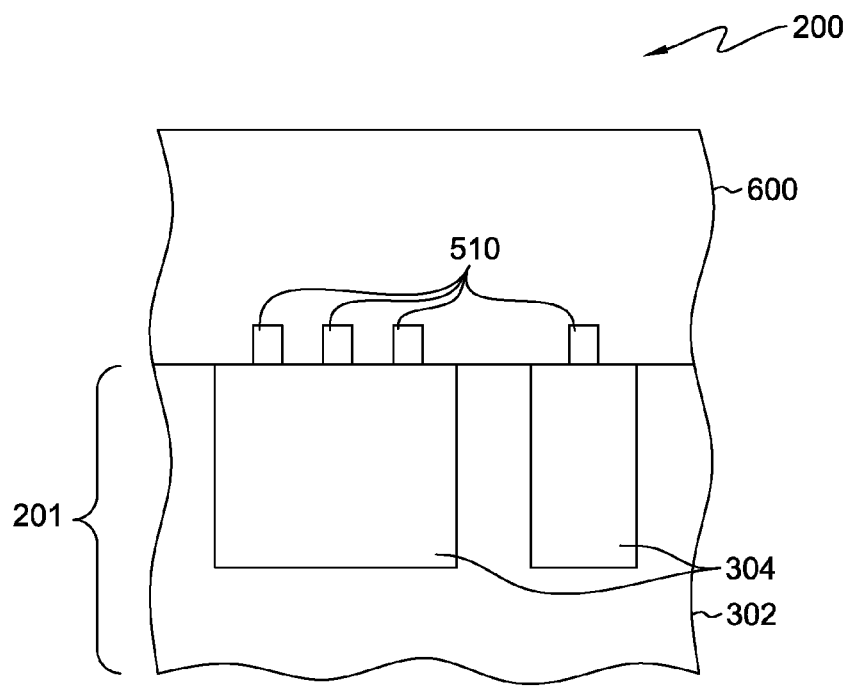

FIGS. 6A & 6B depict structure 200 after providing an isolation layer 600 above first mask 510 and substrate structure 201, in accordance with one or more aspects of the present invention. In one example, isolation layer 600 can include an insulator or material such as a low-k nitride (such as SiBCN), which can be or include the same material as isolation layer 302.

Figure 7A:
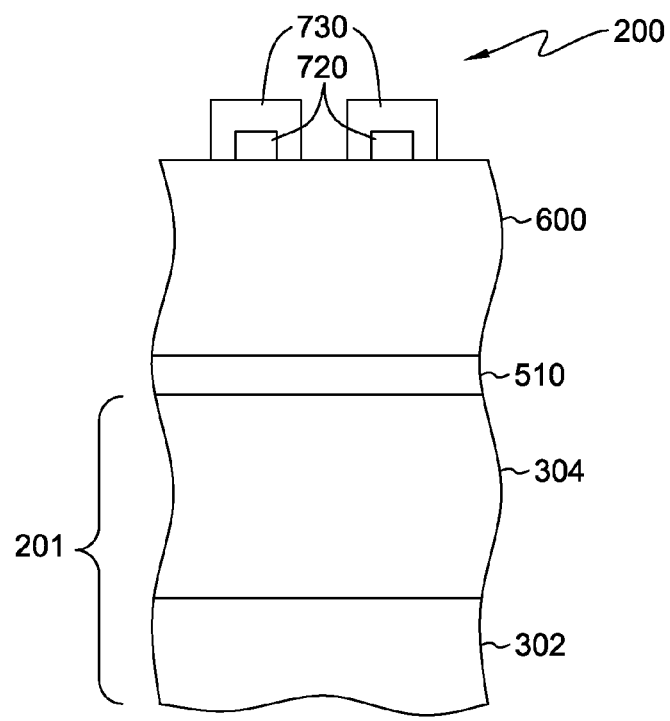
FIGS. 7A & 7B depict the structure of FIGS. 6A & 6B after providing a second mask above the first mask and the substrate structure thereof, in accordance with one or more aspects of the present invention.
Figure 7B:
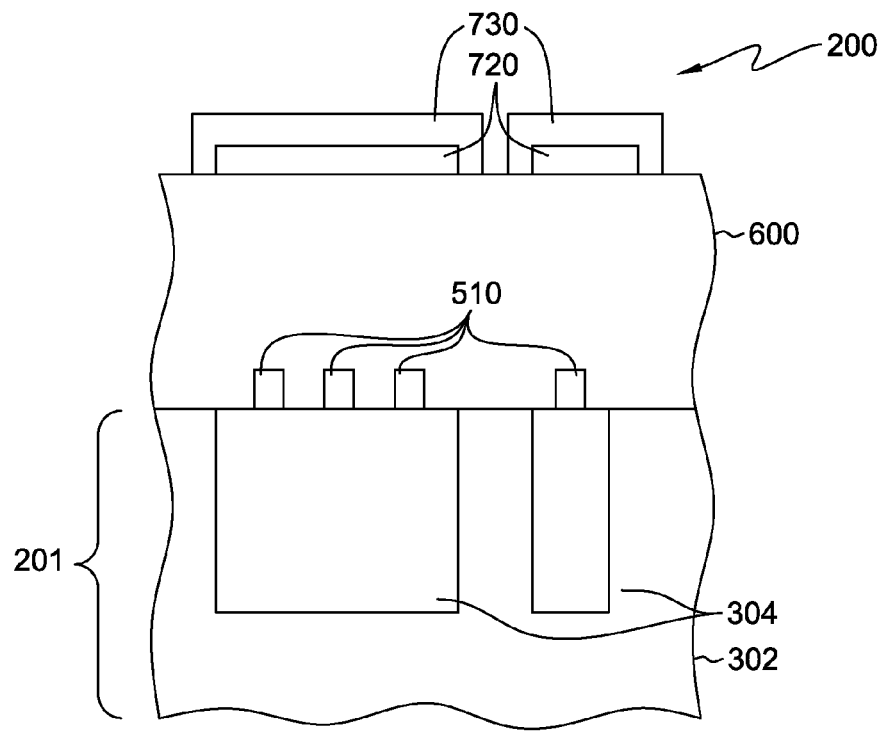

FIGS. 7A & 7B depict structure 200 after providing a second mask 720 above first mask 510 and substrate structure 201, in accordance with one or more aspects of the present invention. In one embodiment, a third mask 730 can be formed adjacent to second mask 720. As described below, third mask 730 can be optionally used to form spacers in a subsequent processing step. In one example, second mask 720 can be or include amorphous silicon (a-Si) and third mask 730 could be or include $SiO_2$.

Figure 8:
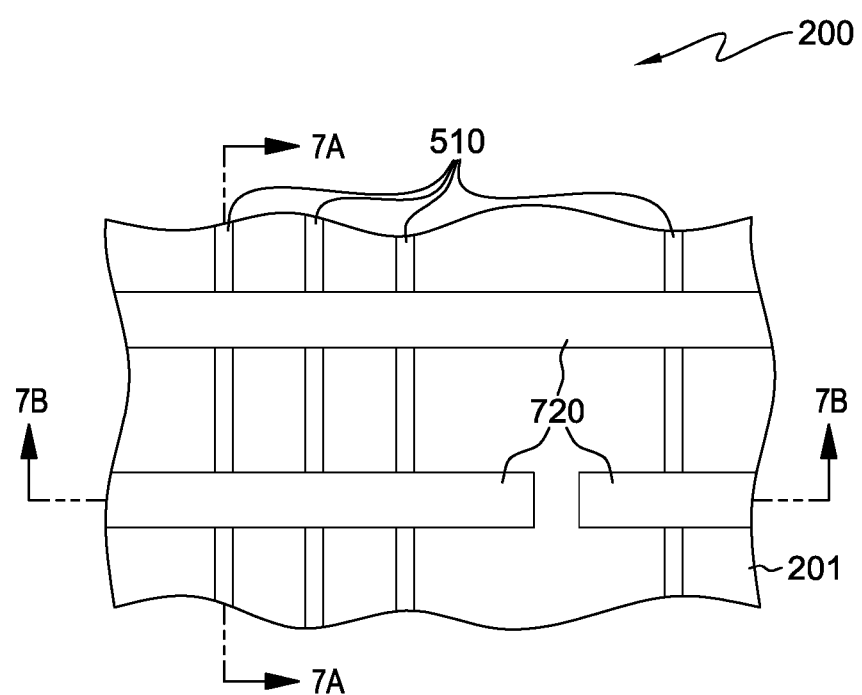
FIG. 8 is a plan view of the structure of FIGS. 7A & 7B, in accordance with one or more aspects of the present invention.

FIG. 8 is a plan view of structure 200 of FIGS. 7A & 7B, in accordance with one or more aspects of the present invention. As illustrated in the plan view, the embodiment of FIG. 8 depicts second mask 720 having at least one rectangular segment, and first mask 510 having multiple rectangular segments. In such a case, the multiple rectangular segments of first mask 510 can be spaced apart, for example, by pre-determined spacing distance. In addition, the multiple rectangular segments of first mask 510 can be substantially perpendicular to the at least one rectangular segment of second mask 720.

By way of example, in a fin-type transistor fabrication process, first mask 510 can be used in the formation of one or more fin structures, and second mask 720 can be used in the formation of one or more gate structures.

Figure 9A:
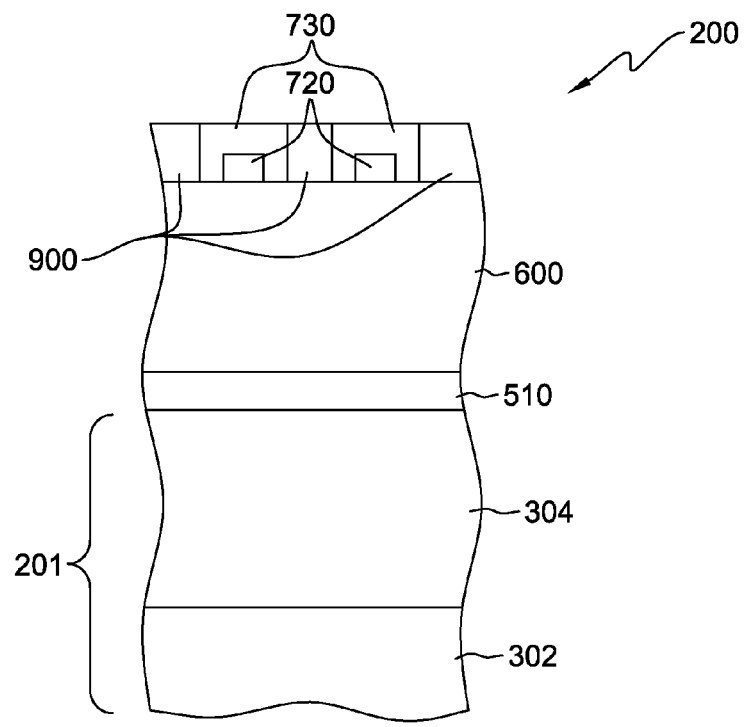
FIGS. 9A & 9B depict the structure of FIGS. 7A & 7B after providing a gap-fill material thereon, in accordance with one or more aspects of the present invention.
Figure 9B:
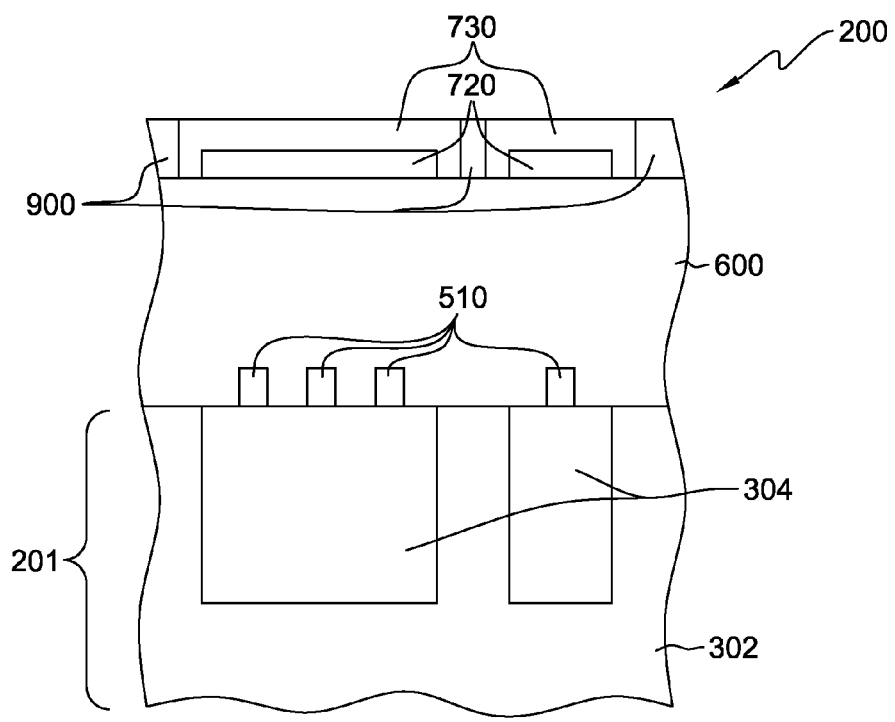

FIGS. 9A & 9B depict structure 200 after providing a gap-fill material 900 thereon, in accordance with one or more aspects of the present invention. In one example, gap-fill material 900 can be, for example, a material with a specific etch property to enable selective etching of gap-fill material 900 without etching other materials.

Figure 10A:
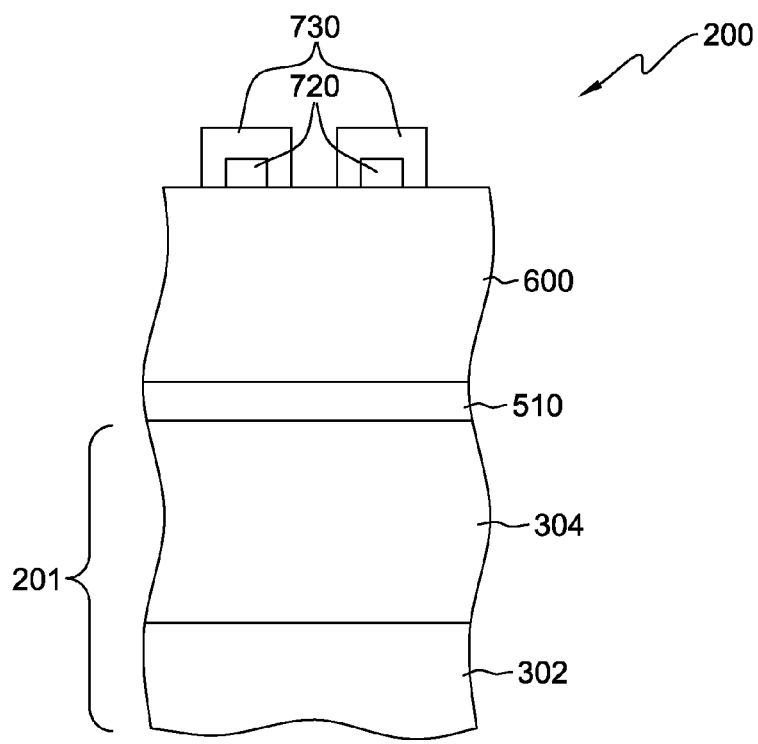
FIGS. 10A & 10B depict the structure of FIGS. 9A & 9B after recessing the gap-fill material from source regions and drain regions of the substrate structure thereof, in accordance with one or more aspects of the present invention.
Figure 10B:
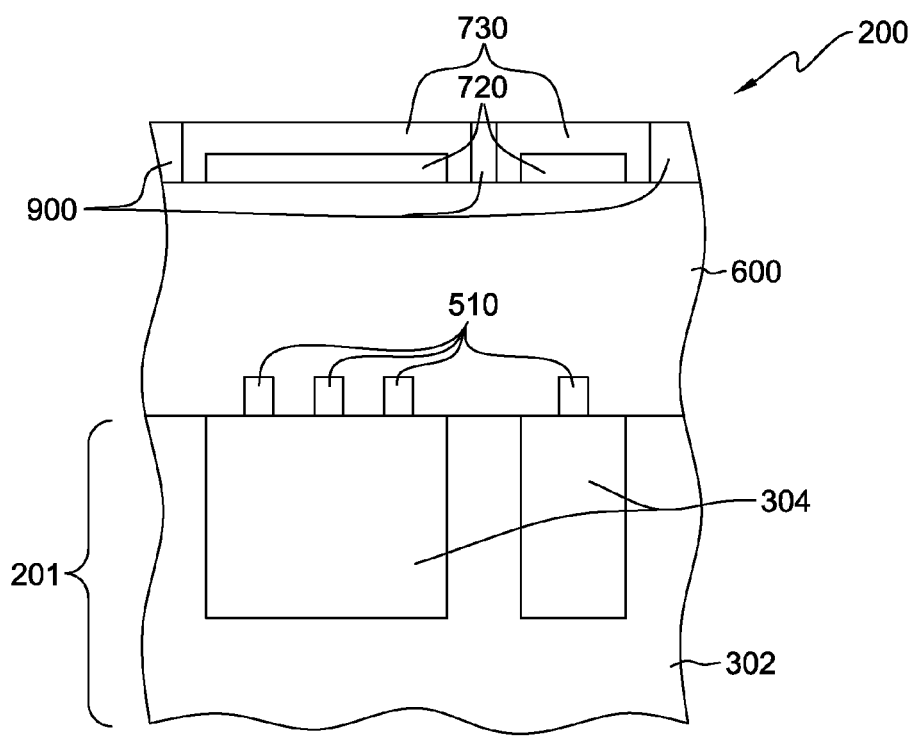

FIGS. 10A & 10B depict the structure 200 after recessing gap-fill material 900 from source regions and drain regions of substrate structure 201, in accordance with one or more aspects of the present invention. For example, such processing may use lithographic patterning and etching processes. In one embodiment, FIG. 10B depicts a cross section of structure 200 taken along the direction in which a gate structure will be subsequently formed, and therefore gap-fill material 900 remains in portions of structure 200 depicted in FIG. 10B. In another embodiment, FIG. 10A depicts a cross section of structure 200 taken along the direction in which a fin structure will be subsequently formed, and therefore gap-fill material 900 is removed in portions of structure 200 depicted in FIG. 10A.

Figure 11A:
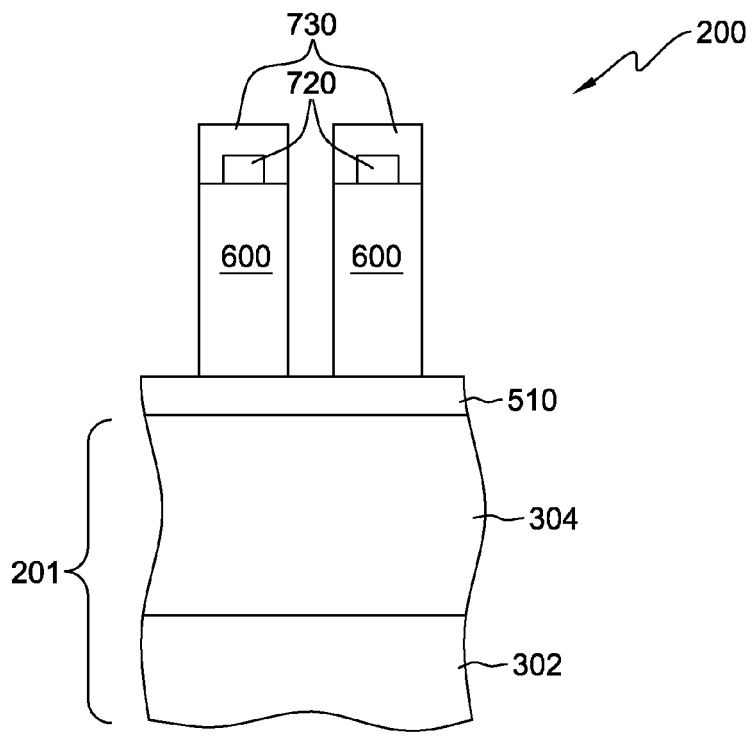
FIGS. 11A & 11B depict the structure of FIGS. 10A & 10B after selectively etching the isolation layer thereof using the second mask thereof, in accordance with one or more aspects of the present invention.
Figure 11B:
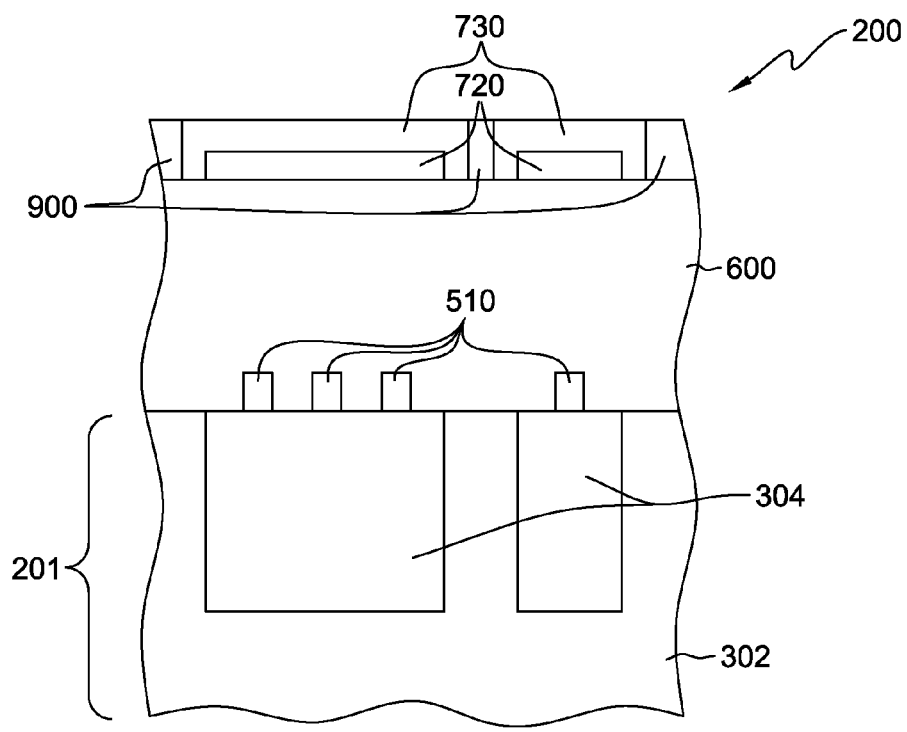

FIGS. 11A & 11B depict structure 200 after selectively etching isolation layer 600 using second mask 720, in accordance with one or more aspects of the present invention. In addition, as illustrated, optional third mask 730 is also used in selectively etching isolation layer 600. After etching isolation layer 600, cavities are created in which contacts to semiconductor regions, such as source/drain regions of fin-type transistors, may be formed in subsequent processing steps.

Figure 12A:
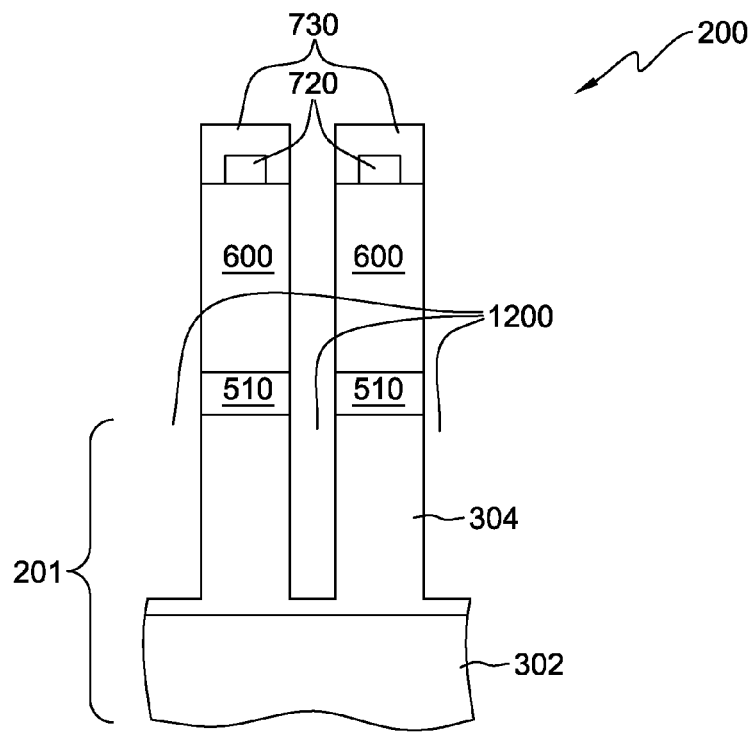
FIGS. 12A & 12B depict the structure of FIGS. 11A & 11B after removing portions of the first mask not underlying the second mask and selectively etching the substrate structure thereof using the second mask to form at least one cavity therein, in accordance with one or more aspects of the present invention.
Figure 12B:
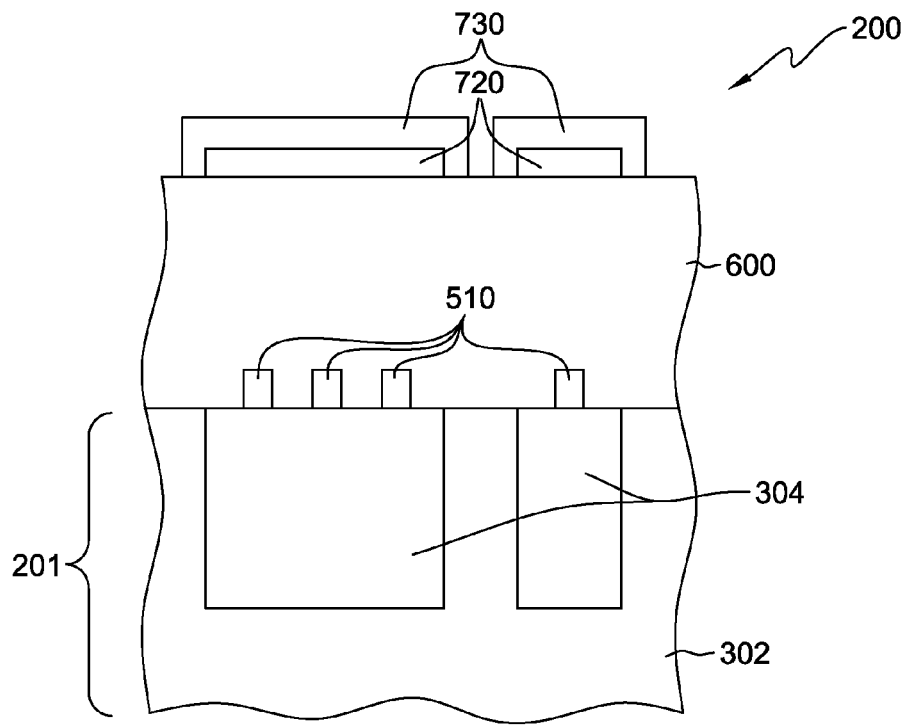

FIGS. 12A & 12B depict structure 200 after removing portions of first mask 510 not underlying second mask 720 and selectively etching substrate structure 201 thereof using second mask 720 to form at least one cavity 1200 therein, in accordance with one or more aspects of the present invention. In one embodiment, the steps illustrated in FIGS. 11A-12B can be part of a single etching process, if appropriate materials and etch chemistry is used. For example, in one embodiment, first mask 510 and second mask 720 have different material compositions, facilitating a single etch chemistry process being used to simultaneously form contact cavities (in isolation layer 600) and cavities 1200. In one example, if gap-fill material is or includes a-Si, it can be etched during etching of semiconductor layer 304.

Figure 13A:
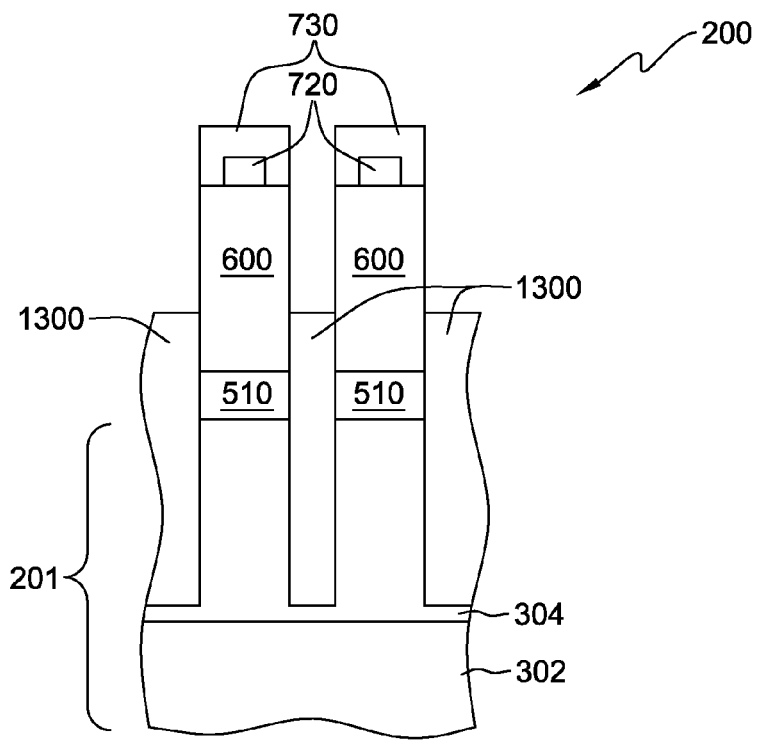
FIGS. 13A & 13B depict the structure of FIGS. 12A & 12B after forming a semiconductor region of the semiconductor structure within the at least one cavity in the substrate structure thereof, in accordance with one or more aspects of the present invention.
Figure 13B:
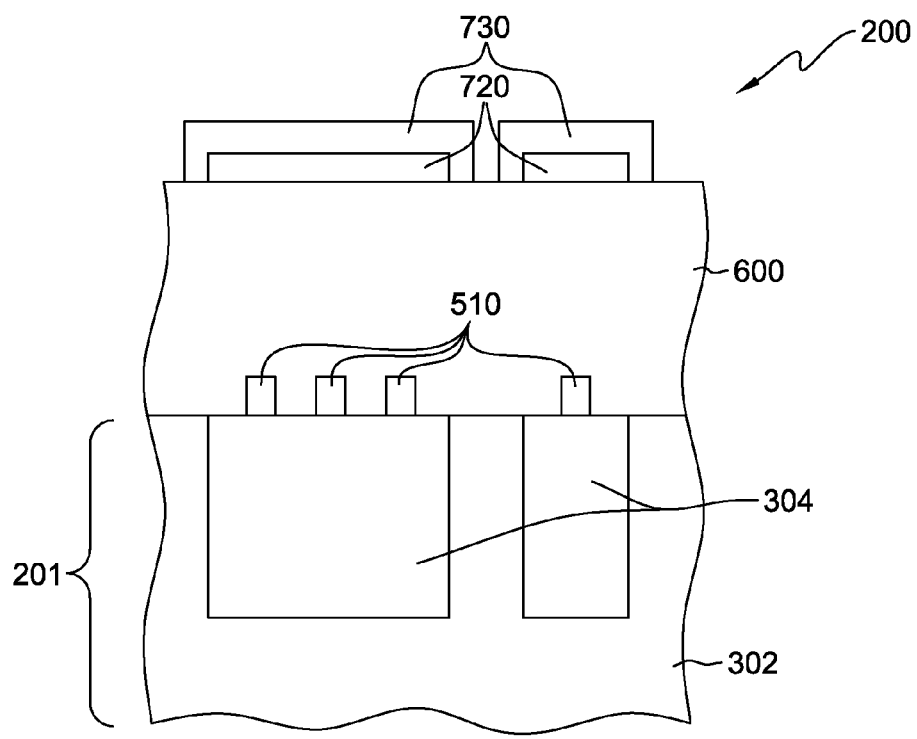

FIGS. 13A & 13B depict structure 200 after forming a semiconductor region 1300 within at least one cavity 1200 (see FIG. 12A) of substrate structure 201, in accordance with one or more aspects of the present invention. In one example, semiconductor regions 1300 can be source/drain regions of a transistor structure.

In one embodiment, semiconductor region 1300 can be epitaxially formed within cavities 1200. In such a case, semiconductor region 1300 can include the same or different material as semiconductor layer 304. For example, semiconductor layer 304 can be silicon, and semiconductor region 1330 can be or include germanium (e.g., silicon germanium with a specific ratio of silicon to germanium). In another embodiment, semiconductor region 1300 can include p-type or n-type impurities, which can be introduced during formation (e.g., in situ doping) or subsequently thereafter.

Figure 14A:
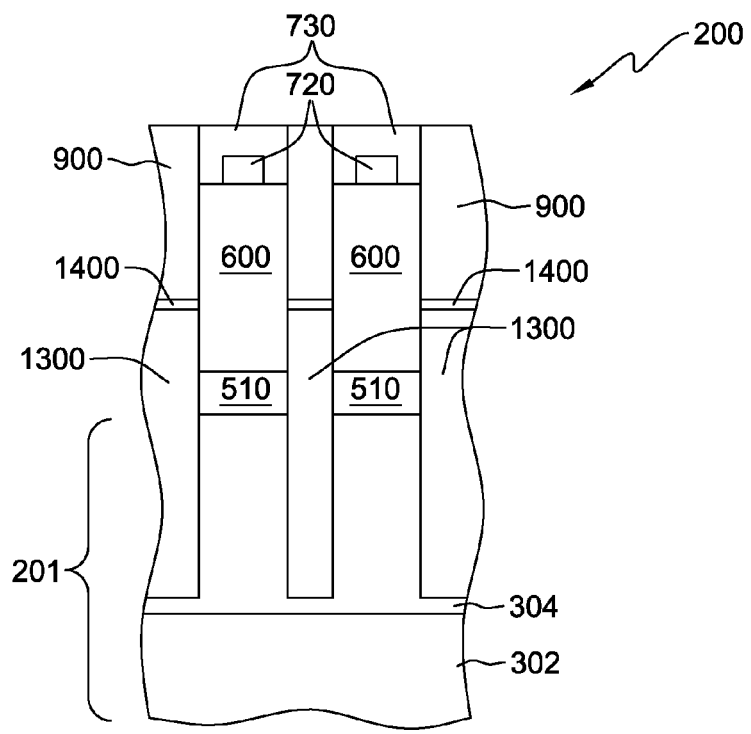
FIGS. 14A & 14B depict the structure of FIGS. 13A & 13B after providing an insulation layer and a gap-fill material on the substrate structure thereof, in accordance with one or more aspects of the present invention.
Figure 14B:
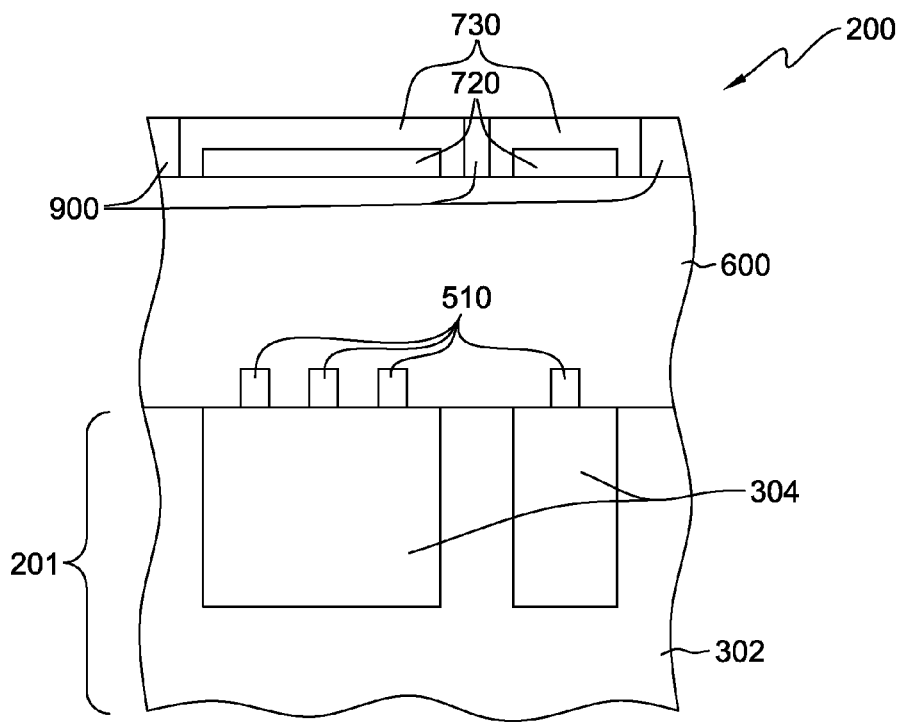

FIGS. 14A & 14B depict structure 200 after providing an insulation layer 1400 and gap-fill material 900 on substrate structure 201, in accordance with one or more aspects of the present invention. For example, insulation layer 1400 can be or include $SiO_2$, and gap-fill material 900 can be or include a-Si. In one embodiment, subsequent to providing the insulation layer, a chemical mechanical polishing (CMP) step may be performed on the top surface of structure 200.

Figure 15A:
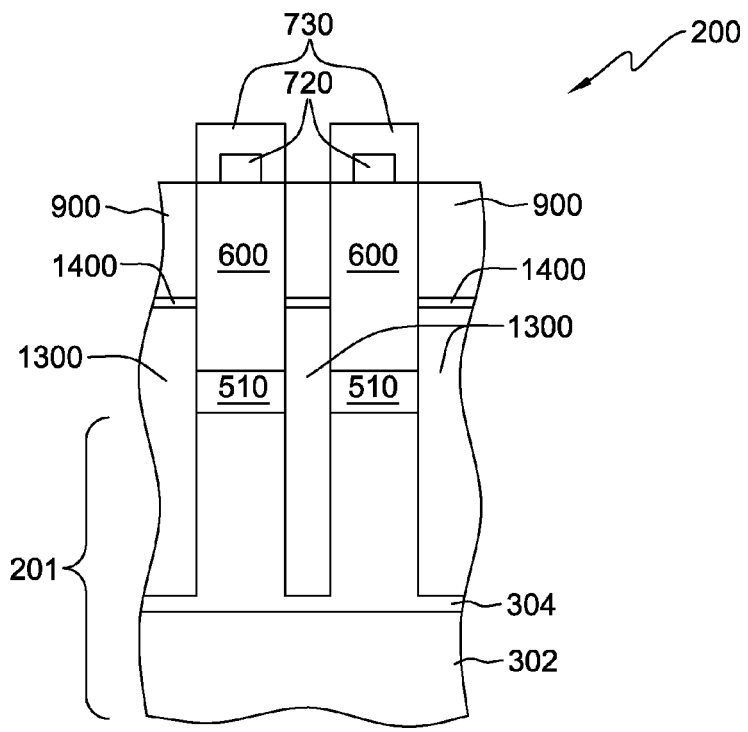
FIGS. 15A & 15B depict the structure of FIGS. 14A & 14B after recessing the gap-fill material thereof, in accordance with one or more aspects of the present invention.
Figure 15B:
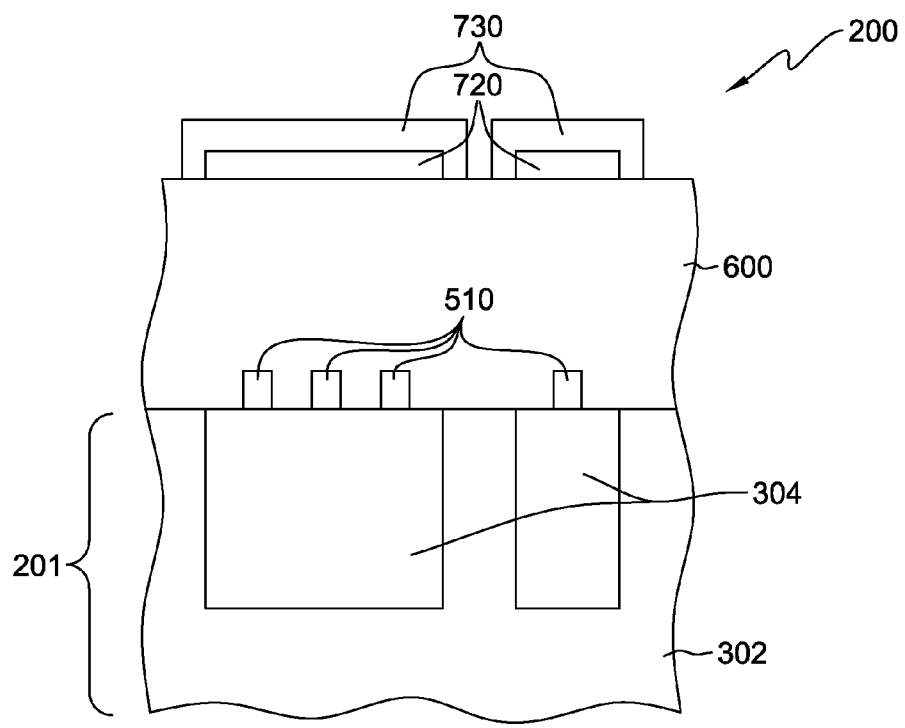

FIGS. 15A & 15B depict structure 200 after recessing gap-fill material 900, in accordance with one or more aspects of the present invention. For example, gap-fill material 900 can be recessed such that an upper surface of gap-fill material 900 is approximately co-planar with a lower surface of second mask 720.

Figure 16A:
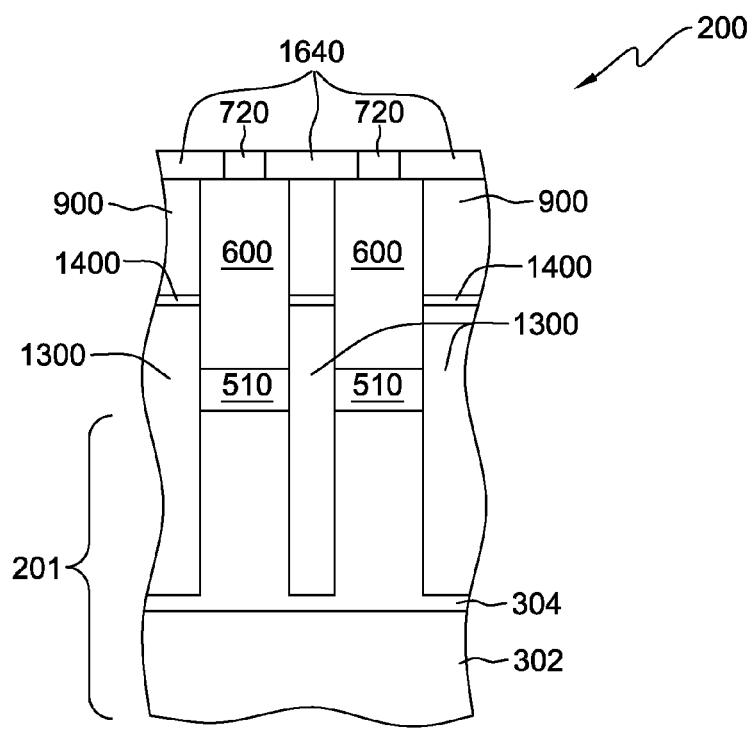
FIGS. 16A & 16B depict the structure of FIGS. 15A & 15B after providing a third mask over portions of the substrate structure thereof not underlying the second mask thereof, in accordance with one or more aspects of the present invention.
Figure 16B:
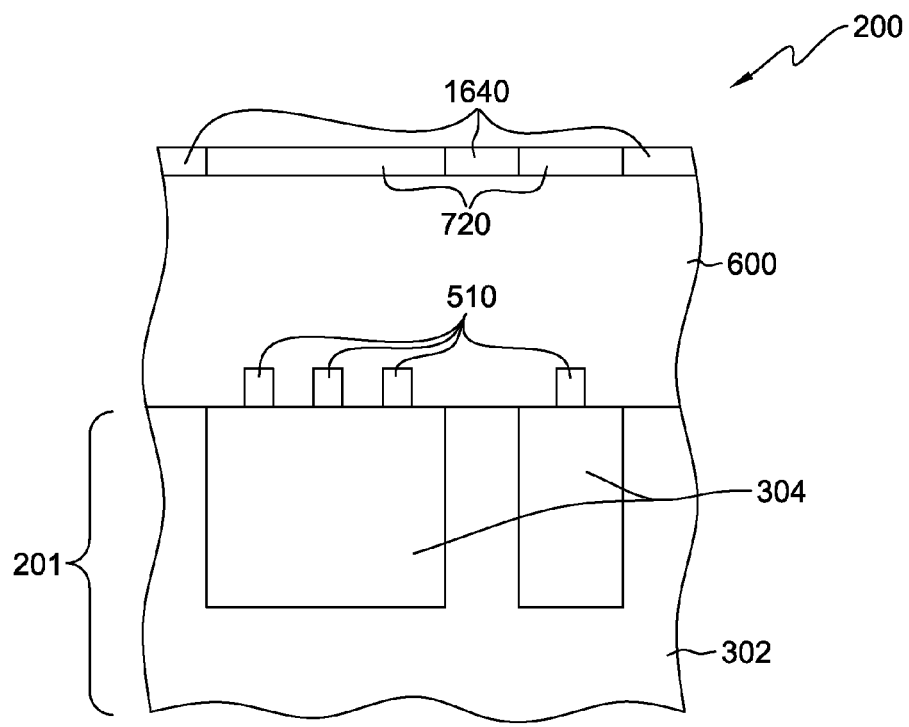

FIGS. 16A & 16B depict structure 200 after providing a fourth mask 1640 over portions of substrate structure 201 not underlying second mask 720, in accordance with one or more aspects of the present invention. For example, a material of fourth mask 1640 can be deposited over structure 200 followed by planarization of structure 200. The material of fourth mask 1640 can have a different etch property as the material of second mask 720 to facilitate selective etching, e.g., a material choice of $SiO_2$. In addition, fourth mask 1640 can be defined to include third mask 730 (see FIG. 15A). In one embodiment, no photolithographic mask is used, and fourth mask 1640 can be blanket deposited followed by CMP.

Figure 17A:
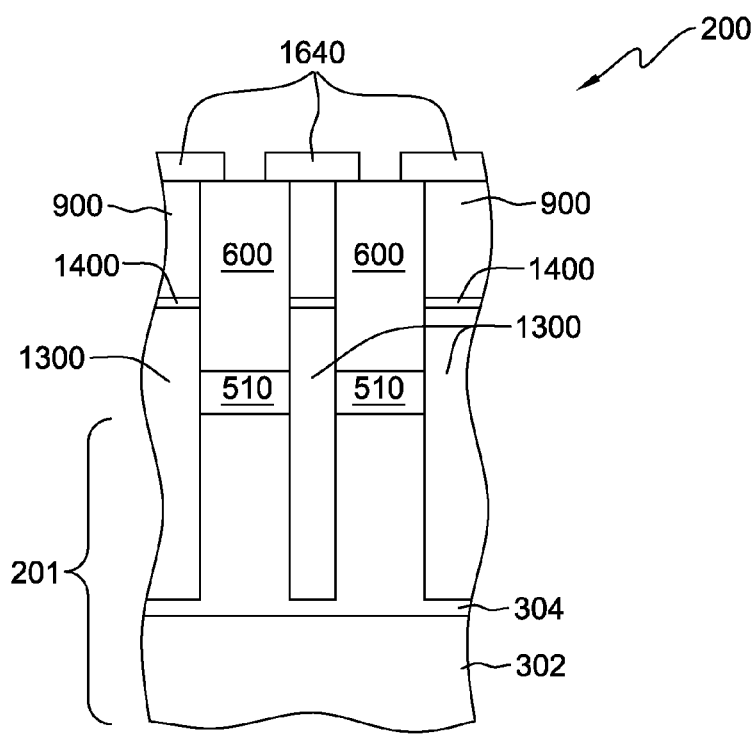
FIGS. 17A & 17B depict the structure of FIGS. 16A & 16B after removing the second mask therefrom, in accordance with one or more aspects of the present invention.
Figure 17B:
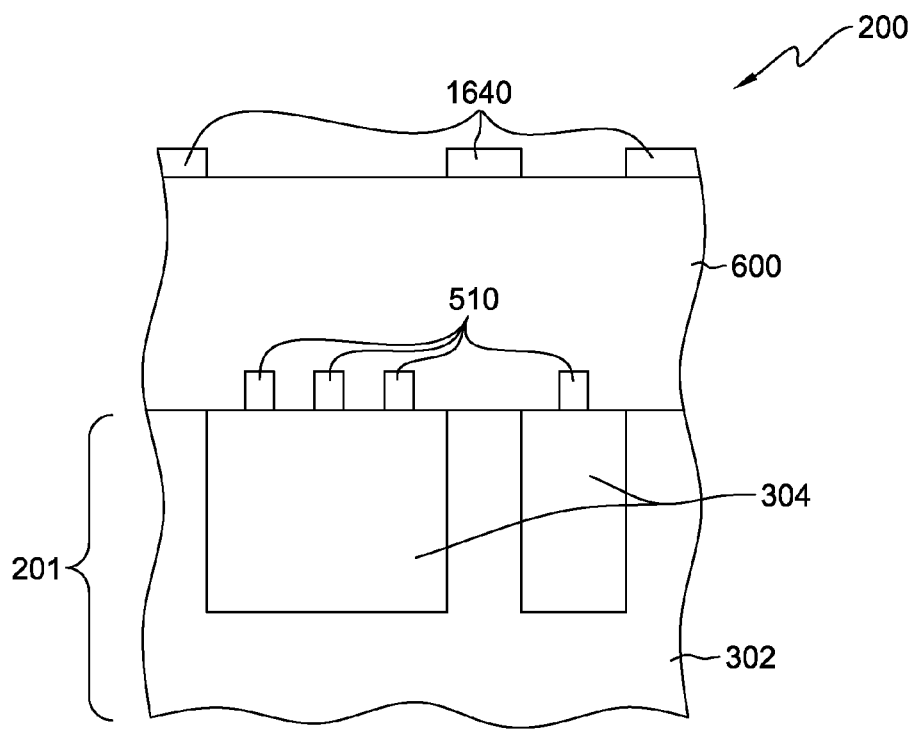

FIGS. 17A & 17B depict structure 200 after removing the second mask therefrom, in accordance with one or more aspects of the present invention. Advantageously, this step results, in part, in an inversion or reversal of the second mask.

Figure 18A:
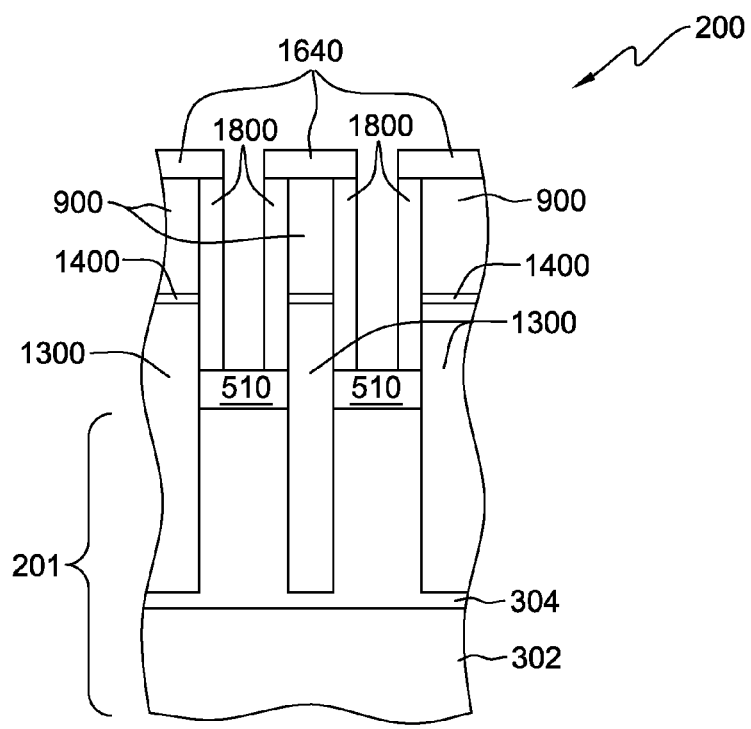
FIGS. 18A & 18B depict the structure of FIGS. 17A & 17B after selectively etching the isolation layer thereof using the third mask thereof to form spacers therefrom, in accordance with one or more aspects of the present invention.
Figure 18B:
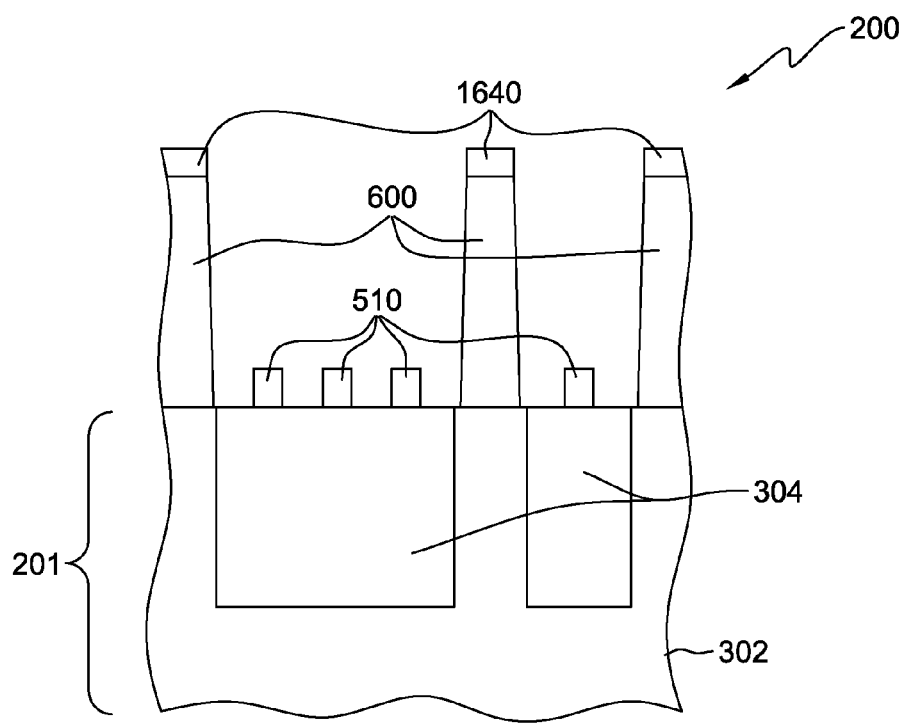

FIGS. 18A & 8B depict structure 200 after selectively etching isolation layer 600 thereof using fourth mask 1640 to form spacers 1800, in accordance with one or more aspects of the present invention. In one embodiment, the use of the third mask, which is included in fourth mask 1640, facilitates spacer formation.

Figure 19A:
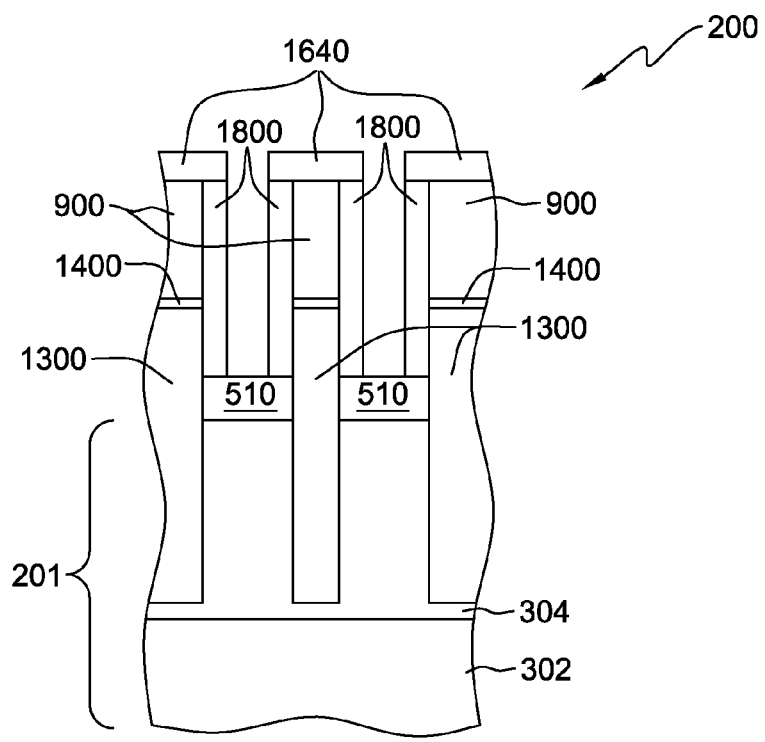
FIGS. 19A & 19B depict the structure of FIGS. 18A & 18B after selectively etching the substrate structure using remaining portions of the first mask and the third mask to form at least one fin structure thereof, in accordance with one or more aspects of the present invention.
Figure 19B:
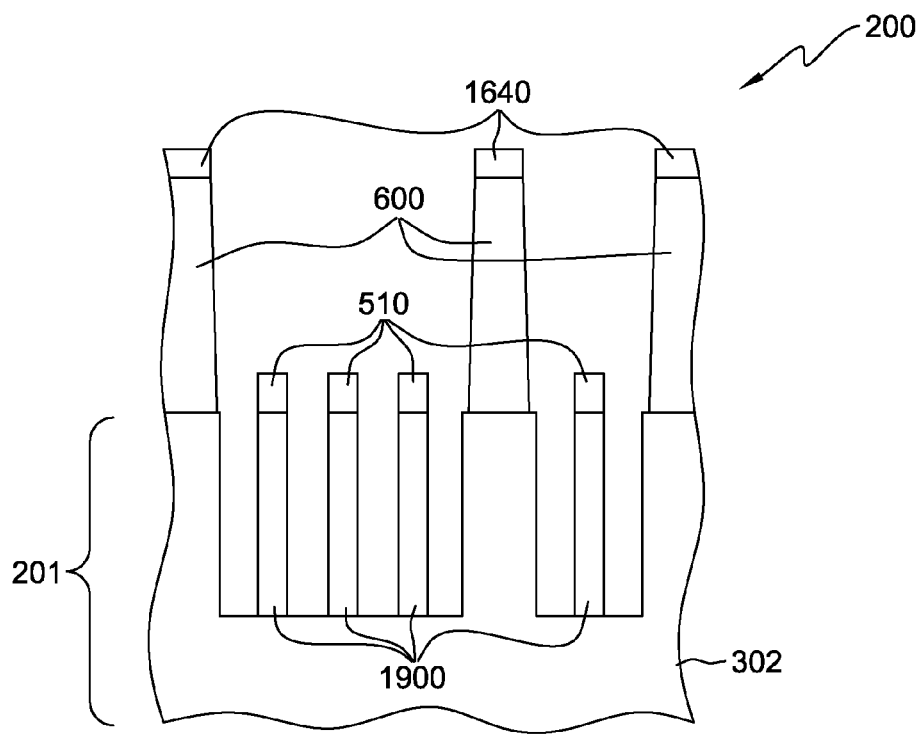

FIGS. 19A & 19B depict structure 200 after selectively etching substrate structure 201 using remaining portions of first mask 510 and the fourth mask 1640 to form at least one fin structure 1900, in accordance with one or more aspects of the present invention. In one embodiment, fin structures 1900 are self-aligned with cavities 1200 (see FIG. 12B) and semiconductor regions 1300. In another embodiment, ends of fin structures 1900 are aligned with edges of cavities 1200 (see FIG. 12B). In another embodiment, ends of fin structures 1900 are aligned with edges of semiconductor regions 1300. In a further embodiment, spacers 1800 are aligned above ends of fin structures 1900 and edges of semiconductor regions 1300.

Advantageously, the techniques of the present disclosure allow formation of the fin structures only in the region which will be surrounded by a conformal gate, allowing the fin structures to be formed at a late stage of fabrication processing. By contrast, techniques in which fin structures are formed everywhere in an initial step lead to numerous process challenges involving the use of sacrificial gates and/or spacers that must be etched out and removed. In an example where it is desired to have extremely tall fin structures, removal of sacrificial structures can be quite challenging because of the aspect ratio of the height of the tall fin structures and the lateral spacing thereof.

Further, the techniques of the present disclosure allow for the formation of fin structures that are self-aligned with cavities (or semiconductor regions formed therein). In, for example, a fin-type transistor, source/drain regions must be adjacent to channel regions of the fin-type transistor, but gate contacts and source/drain contacts must be separated by a sufficient distance to prevent short-circuiting. However, separation by too great a distance can lead to poor gate control of the channel. The techniques described herein allow for precise self-alignment of semiconductor regions (e.g., source/drain regions) with fin structures (e.g., having channel regions), and optionally allow for precise self-alignment of spacers (e.g., using the third mask). The alignment described herein is achieved without having to manually align photolithographic masks, and therefore achieves alignment within tolerances that are sub-lithographic, for example on the order of nanometers or angstroms.

Figure 20A:
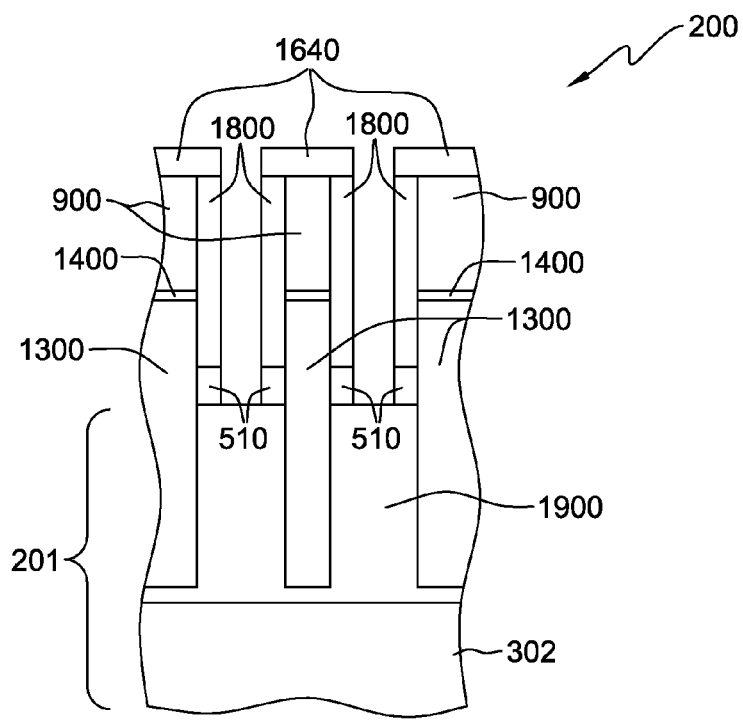
FIGS. 20A & 20B depict the structure of FIGS. 19A & 19B after removing some of the remaining portions of the first mask, in accordance with one or more aspects of the present invention.
Figure 20B:
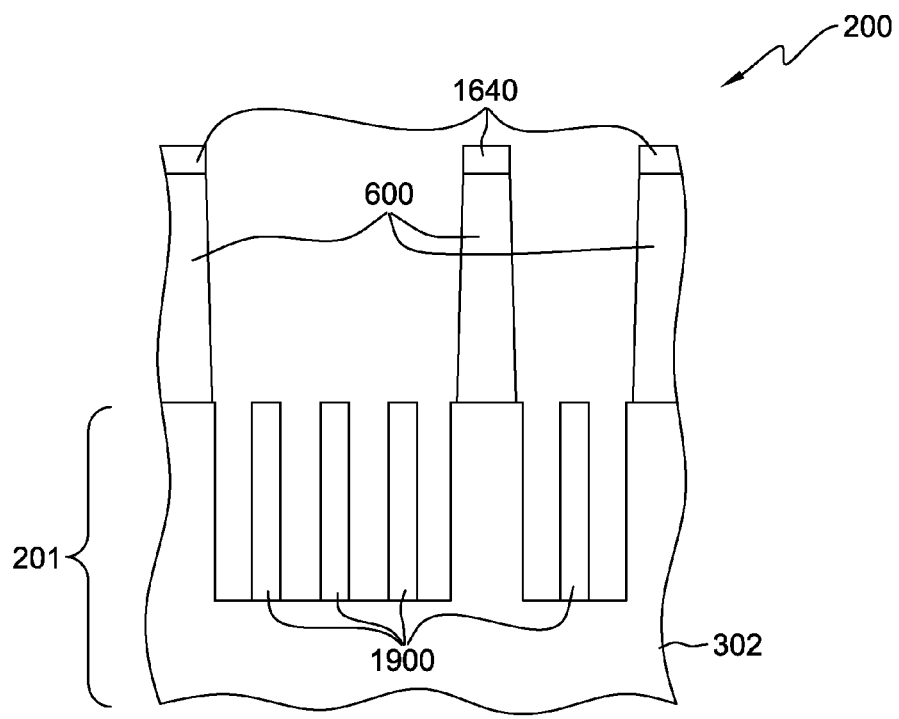

FIGS. 20A & 20B depict structure 200 after removing some of the remaining portions of first mask 510, in accordance with one or more aspects of the present invention. In one embodiment, certain portions of first mask 510 may remain underneath spacers 1800.

Figure 21A:
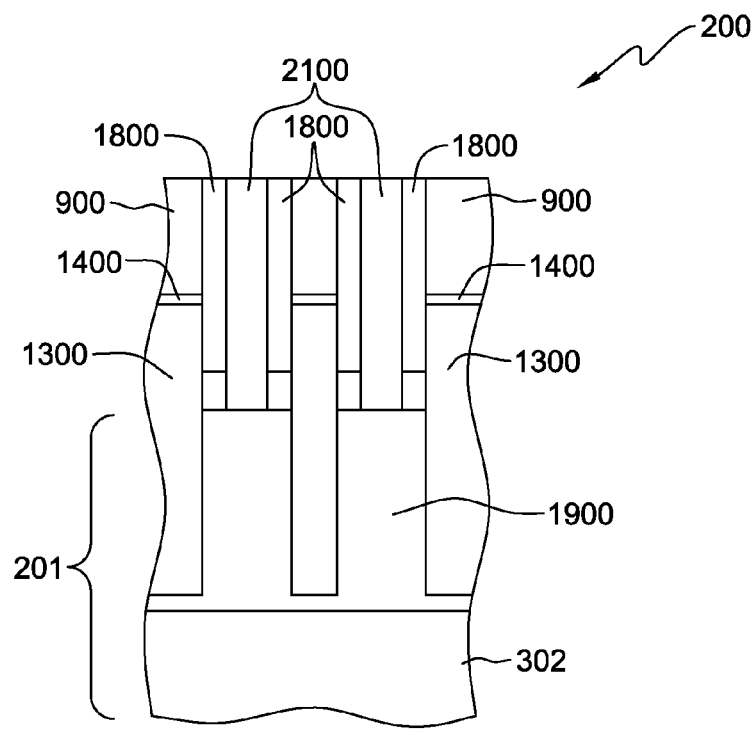
FIGS. 21A & 21B depict the structure of FIGS. 20A & 20B after forming a contact structure at least partially surrounding the at least one fin structure thereof, in accordance with one or more aspects of the present invention.
Figure 21B:
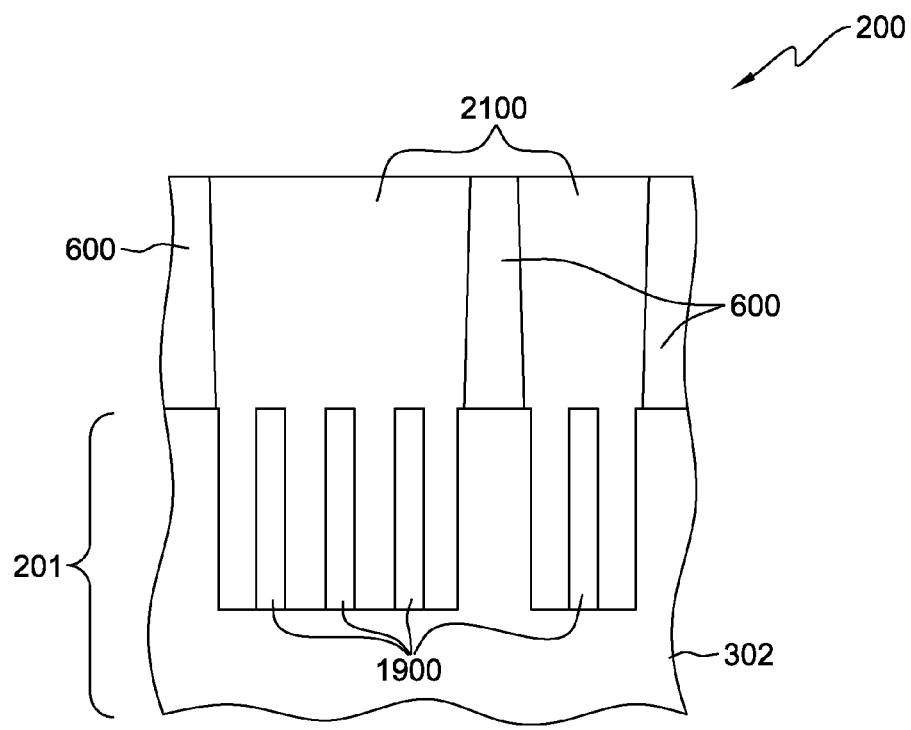

FIGS. 21A & 21B depict structure 200 after forming a gate structure 2100 at least partially surrounding at least one fin structure 1900, in accordance with one or more aspects of the present invention. For example, gate structure 2100 can be a gate contact structure that conforms around fin structures 1900 to allow gate control of channel regions of fin-type transistors. Advantageously, the techniques described herein allow for self-aligned formation of fin structures 1900 in such a way that only portions of substrate structure 201 that are to be contacted by gate structure 2100 are exposed, including the provision of spacers 1800 so that contact structures 2100 are offset from semiconductor regions 1300 by a pre-determined spacer distance. Therefore, formation of gate structures 2100 allows self-alignment of the contact structures. By contrast, methods that form a plurality of fins in an initial processing step require later (manual) alignment of contact structures.

Figure 22A:
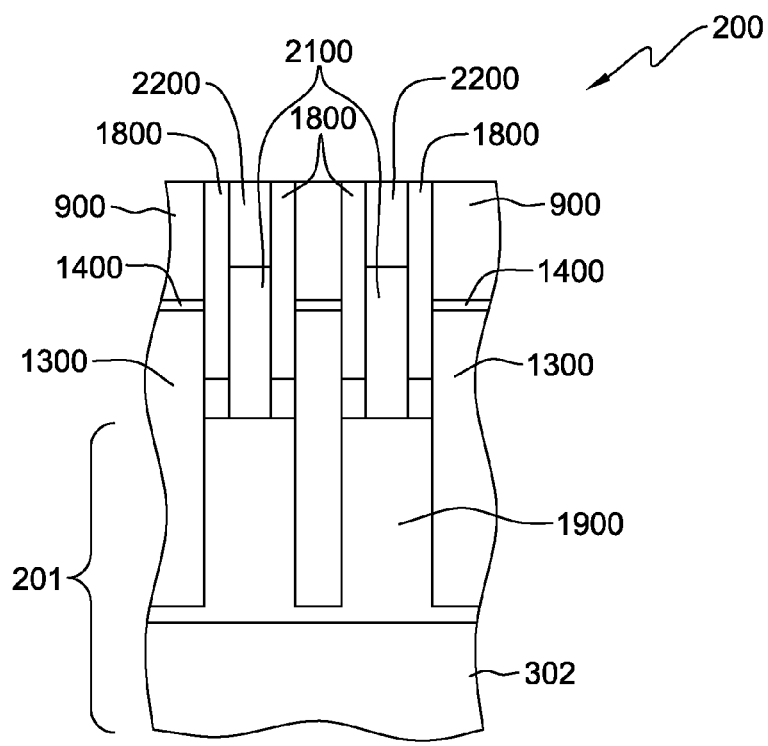
FIGS. 22A & 22B depict the structure of FIGS. 21A & 21B after recessing the contact structure thereof and forming a contact cap thereon, in accordance with one or more aspects of the present invention.
Figure 22B:
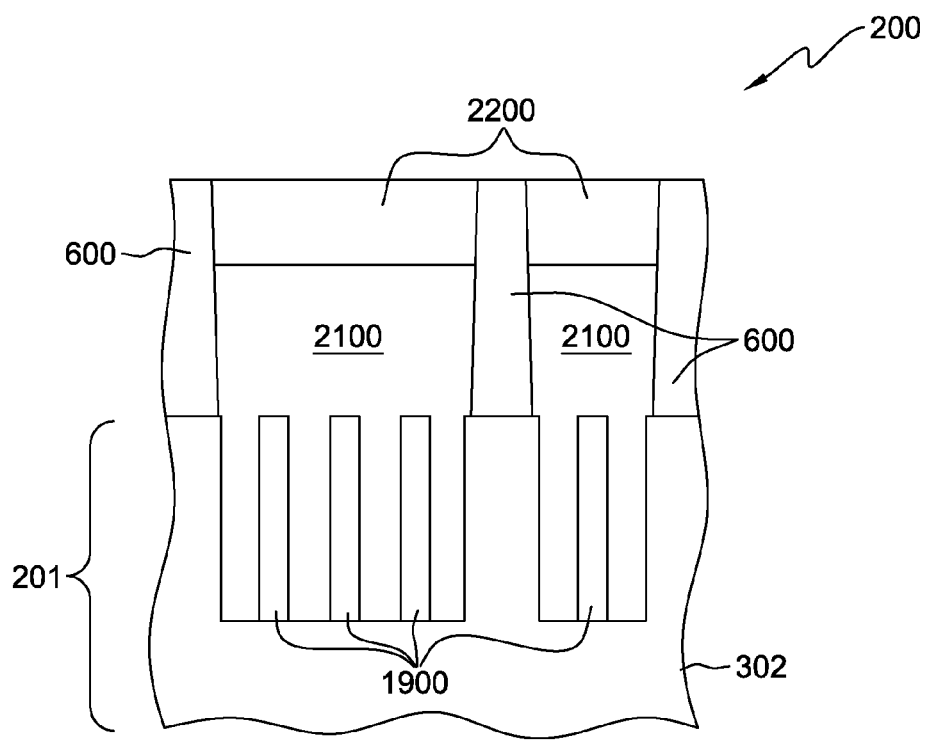

FIGS. 22A & 22B depict structure 200 after recessing gate structure 2100 and forming a contact cap 2200 thereon, in accordance with one or more aspects of the present invention.

Figure 23A:
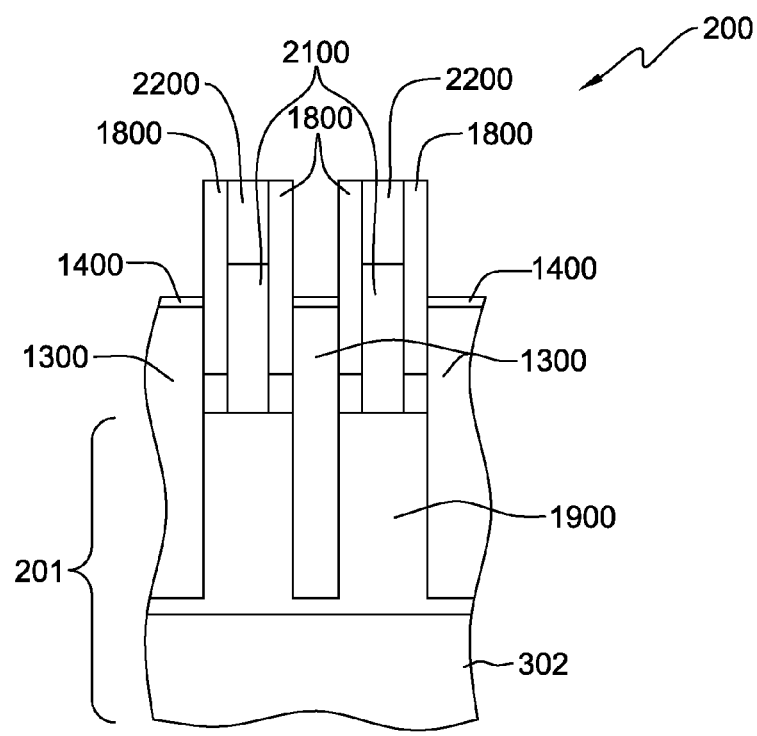
FIGS. 23A & 23B depict the structure of FIGS. 22A & 22B after removing the gap-fill material thereof, in accordance with one or more aspects of the present invention.
Figure 23B:
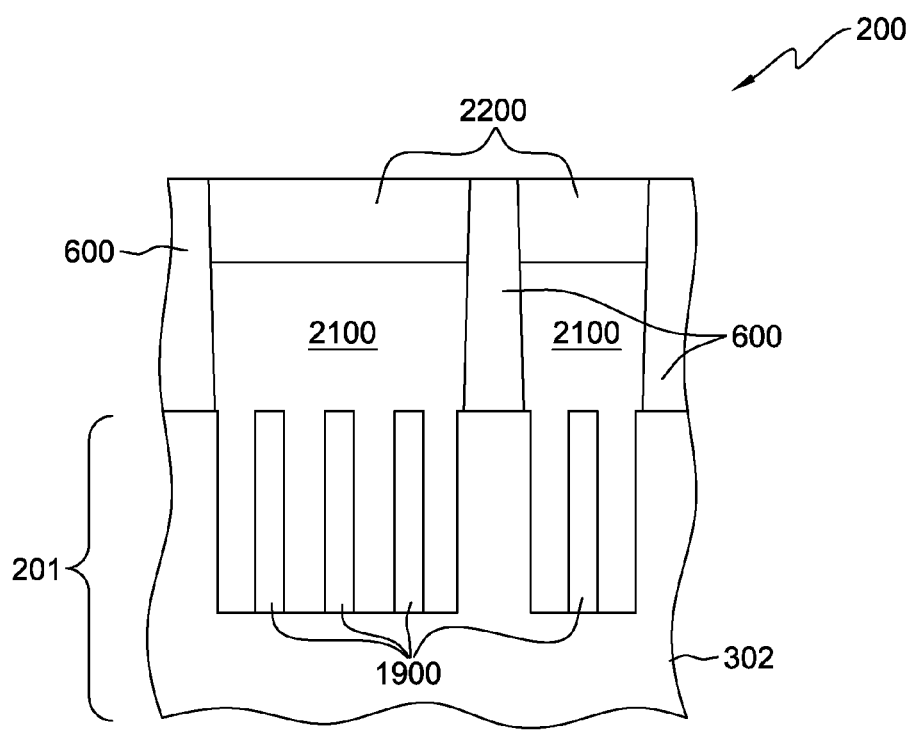

FIGS. 23A & 23B depict structure 200 after removing gap-fill material 900, in accordance with one or more aspects of the present invention. Advantageously, gap-fill material 900 was previously deposited in contact cavities that were formed above semiconductor regions 1300, so the removal of gap-fill material 900 allow self-aligned restoration of those contact cavities without the use of photo-lithographic masking.

Figure 24A:
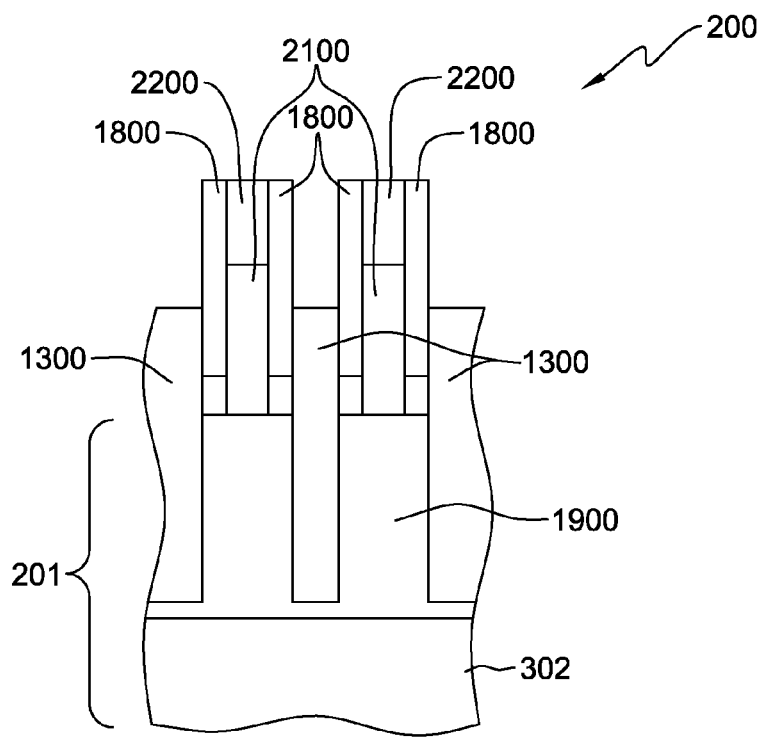
FIGS. 24A & 24B depict the structure of FIGS. 23A & 23B after removing the insulation layer thereof, in accordance with one or more aspects of the present invention.
Figure 24B:
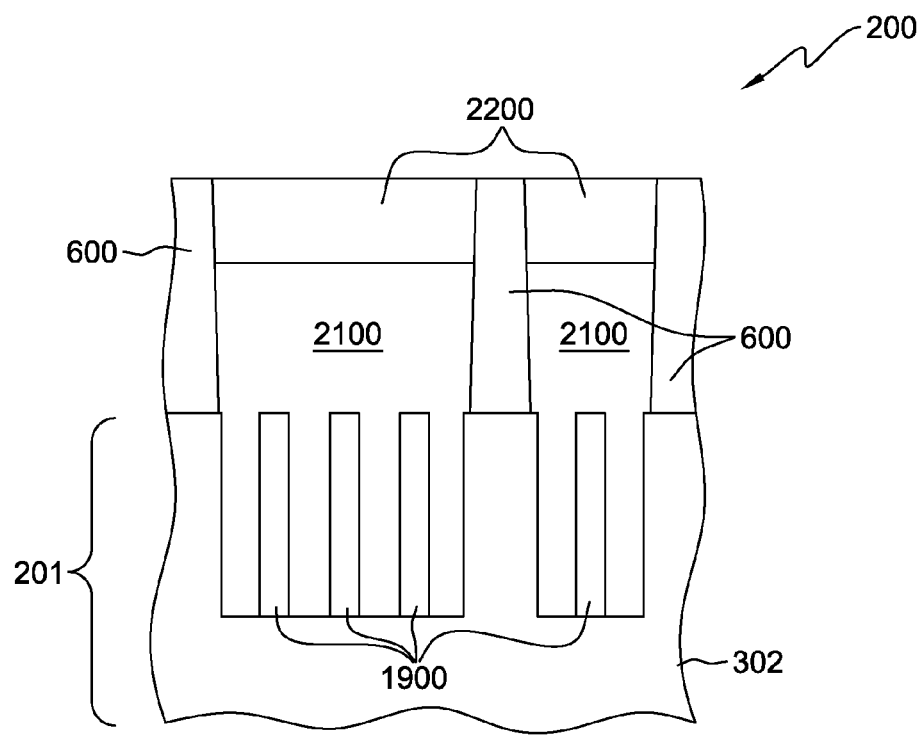

FIGS. 24A & 24B depict structure 200 after removing insulation layer 1400, in accordance with one or more aspects of the present invention.

Figure 25A:
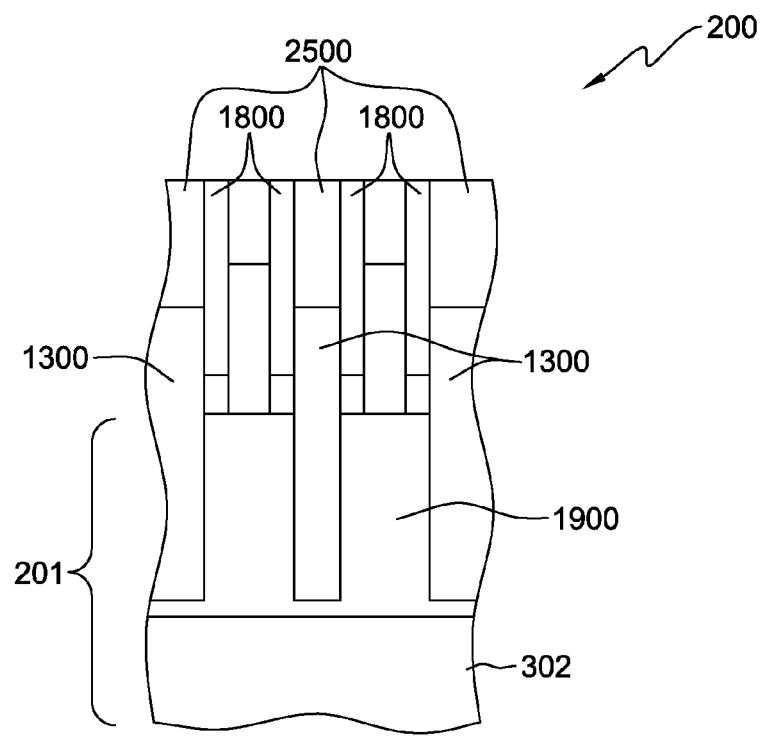
FIGS. 25A & 25B depict the structure of FIGS. 24A & 24B after forming contact structures thereon, in accordance with one or more aspects of the present invention.
Figure 25B:
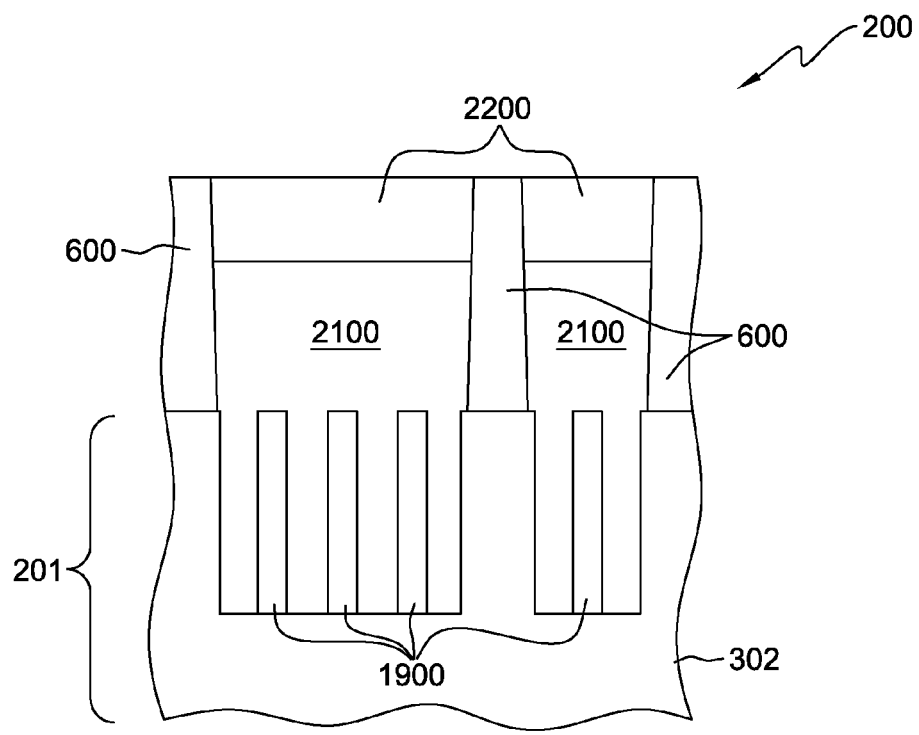

FIGS. 25A & 25B depict structure 200 after forming contact structures 2500 (e.g., source/drain contact structures) thereon, in accordance with one or more aspects of the present invention. In one embodiment, spacers 1800 allow for separation of contact structures 2100 and contact structures 2500 by a pre-determined spacer distance. For example, for fin-type transistors, this allows for optimal gate control of fin structures 1900 without short-circuiting.

FIGS. 26A-30 depict various techniques that may be employed in the fabrication of semiconductor device structures with self-aligned fin structures, in accordance with one or more aspects of the present invention.

Figure 26A:
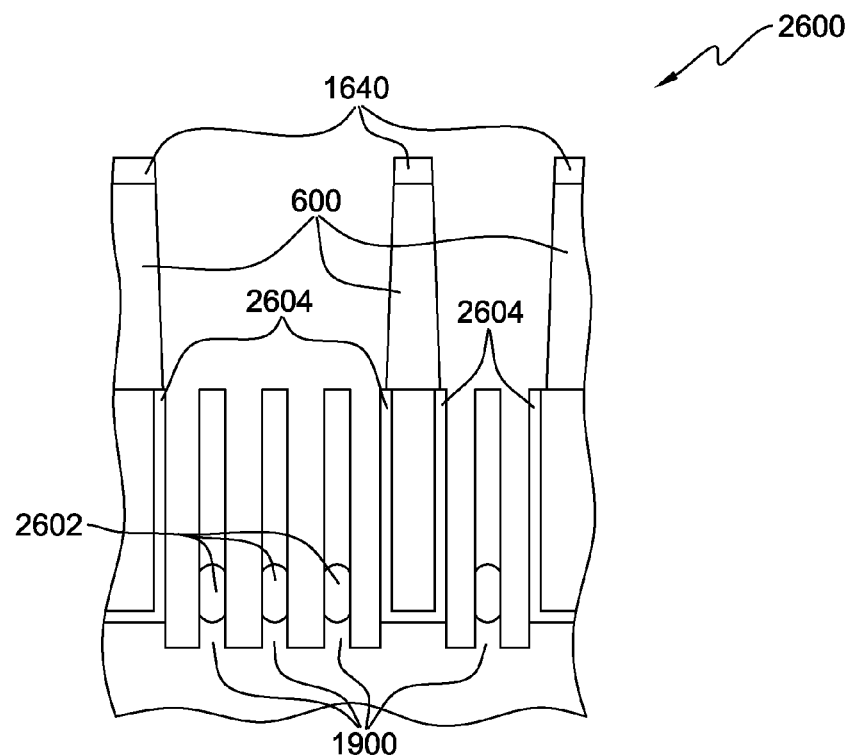
FIGS. 26A & 26B depict the structure of FIGS. 20A & 20B after implanting impurities within lower portions of the at least one fin structure thereof to form an isolation layer therein, in accordance with one or more aspects of the present invention.
Figure 26B:
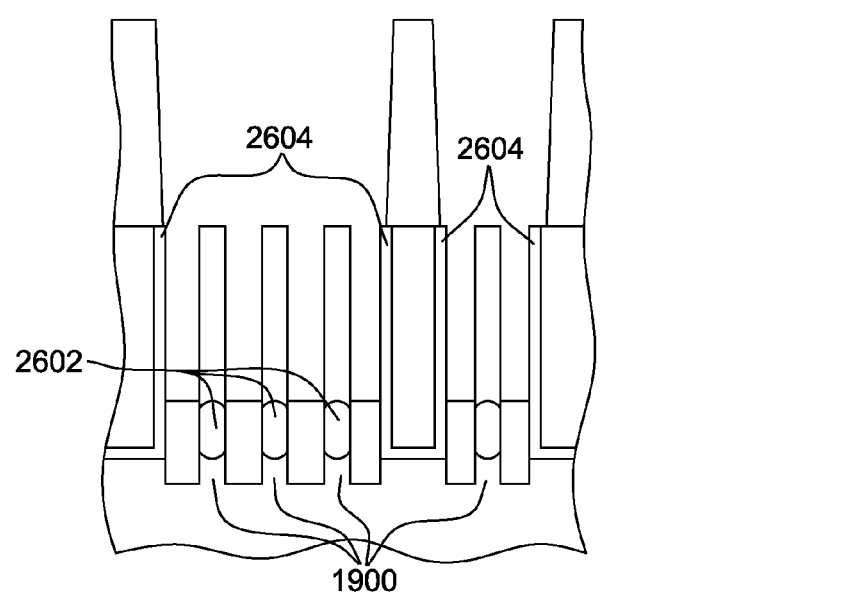

FIGS. 26A & 26B depict the structure of FIGS. 20A & 20B after implanting impurities within lower portions of at least one fin structure 1900 to form an isolation layer 2602, in accordance with one or more aspects of the present invention. In one embodiment, the impurities are p-type and/or n-type impurities. In another embodiment, lower portions of fin structures 1900 can be surrounded by an isolation material formed by deposition of, for example, an oxide material, followed by recess after removal of a sacrificial gate. In such a case, a liner 2604 may be used so that trench isolation may be preserved during such processing. In one example, liner 2604 may include silicon nitride.

Figure 27A:
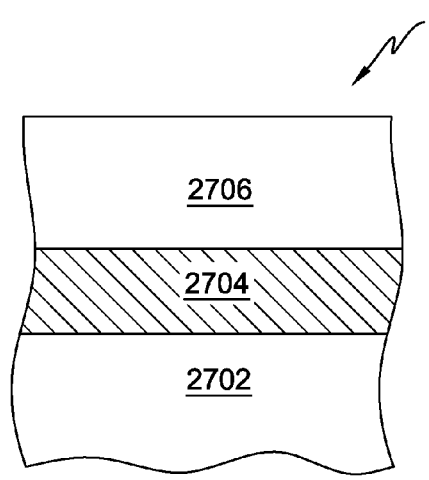
FIGS. 27A-27D depict embodiments of processes for fabricating semiconductor device structures, in accordance with one or more aspects of the present invention.
Figure 27B:
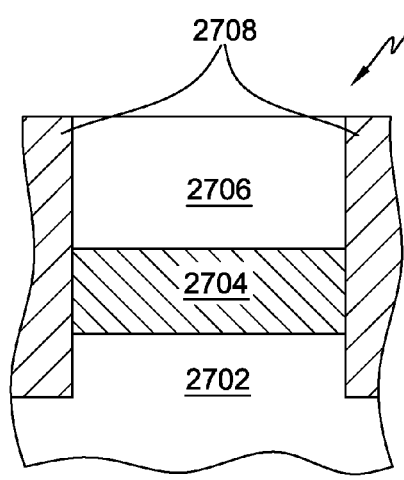
Figure 27C:
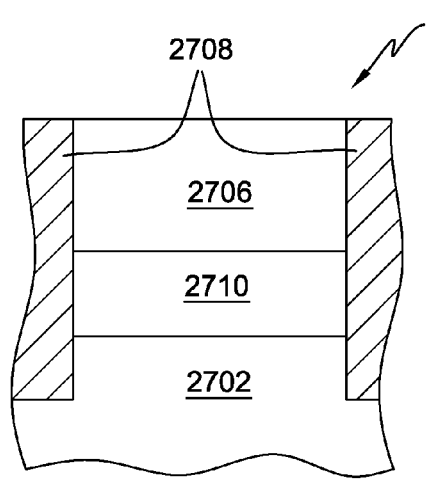
Figure 27D:
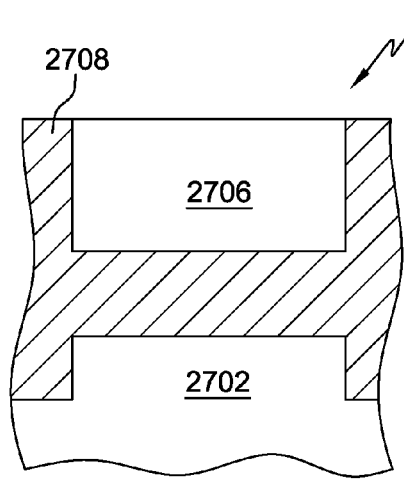

FIGS. 27A-27D depict embodiments of processes for fabricating semiconductor device structures, in accordance with one or more aspects of the present invention. FIG. 27A is a cross-sectional elevational view of a structure found in semiconductor device fabrication processing, in accordance with one or more aspects of the present invention. In the embodiment of FIG. 27A, a structure 2700 includes a first layer 2702, a second layer 2704, and a third layer 2706. In one example, first layer 2702 and third layer 2706 include the same semiconductor materials, and second layer 2704 includes a different semiconductor material. FIG. 27B depicts structure 2700 after providing isolation material 2708, in accordance with one or more aspects of the present invention. FIG. 27C depicts structure 2700 after removing second layer 2704 (see FIG. 27B) to form a void 2710, in accordance with one or more aspects of the present invention. FIG. 27D depicts structure 2700 after providing isolation material 2708 in void 2710 (see FIG. 27B), in accordance with one or more aspects of the present invention.

Figure 28A:
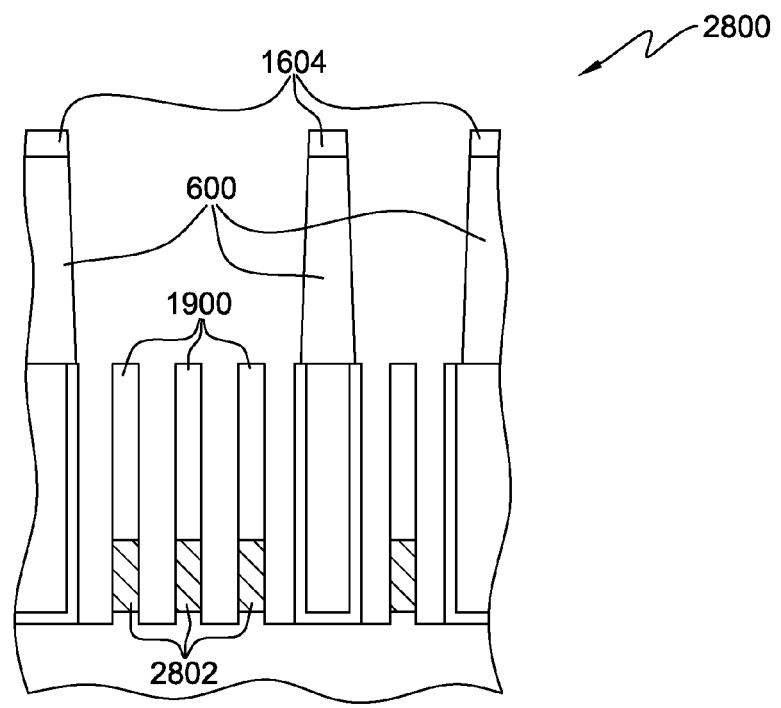
FIGS. 28A-28D depict embodiments of a process for providing the structure of FIGS. 20A & 20B with an isolation layer after forming the at least one fin structure thereof, in accordance with one or more aspects of the present invention.
Figure 28B:
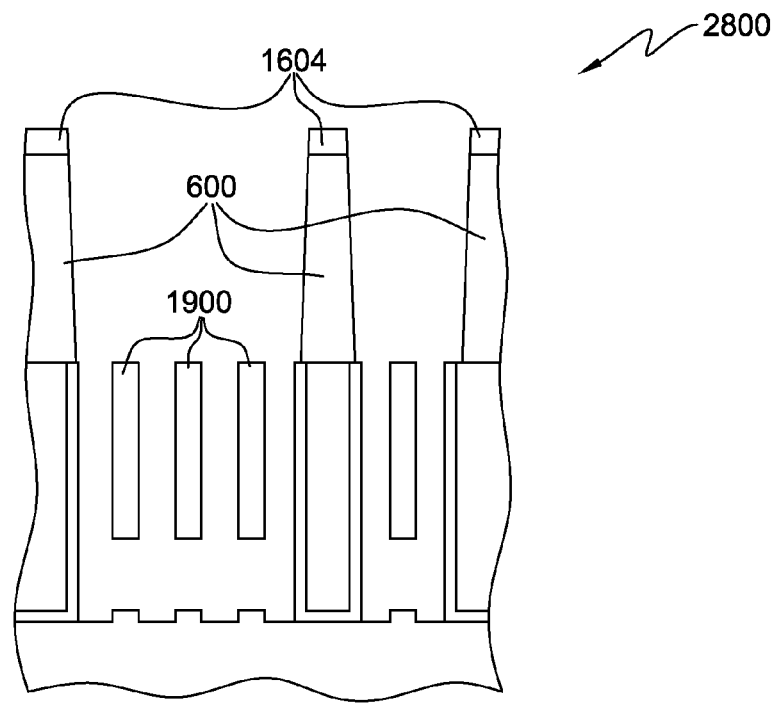
Figure 28C:
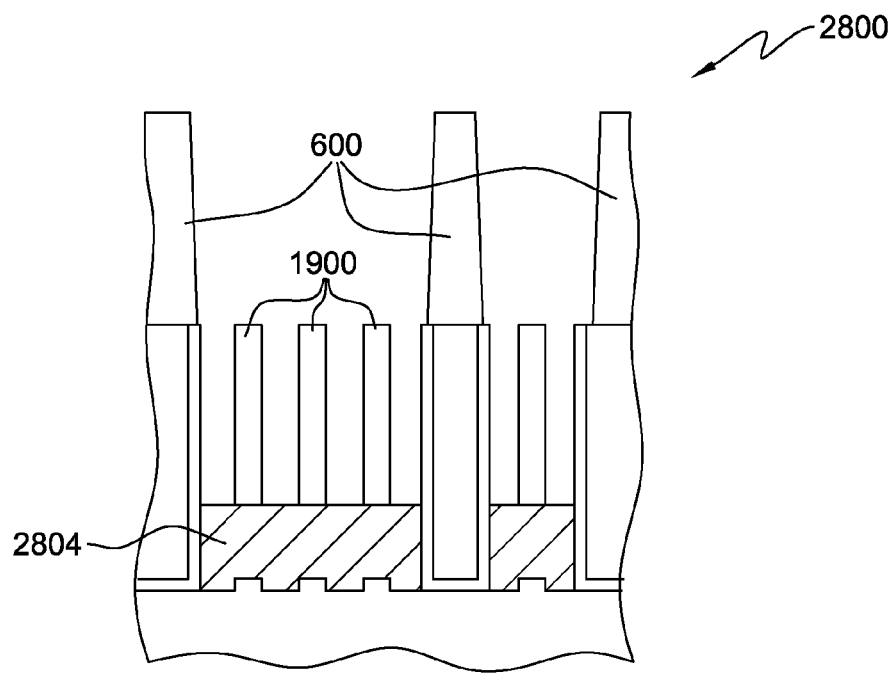
Figure 28D:
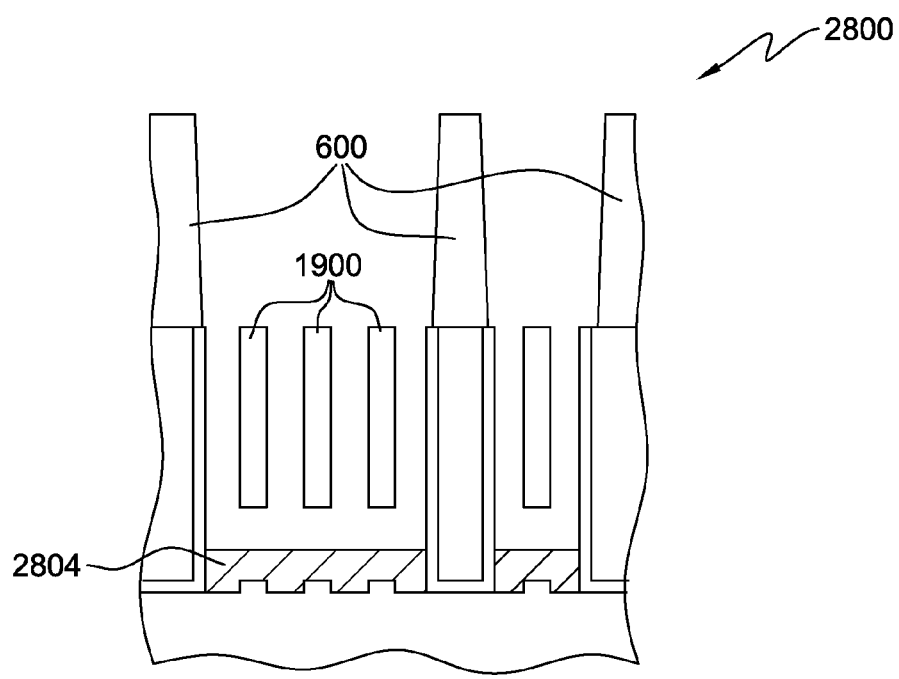

FIGS. 28A-28D depict embodiments of a process for providing the structure of FIGS. 20A & 20B with an isolation layer 2802 after forming the at least one fin structure thereof, in accordance with one or more aspects of the present invention. For example, in FIG. 28A, isolation layer 2802 is provided in lower portions of fin structures 1900 of structure 2800. FIG. 28B depicts structure 2800 after removing isolation layer 2802 to form voids below fin structures 1900, in accordance with one or more aspects of the present invention. FIG. 28C depicts structure 2800 after depositing another isolation layer 2804 followed by recess thereof, in accordance with one or more aspects of the present invention. FIG. 28D depicts structure 2800 after further recessing isolation layer 2804 to allow for a gate-all-around device to be formed, in accordance with one or more aspects of the present invention.

Figure 29A:
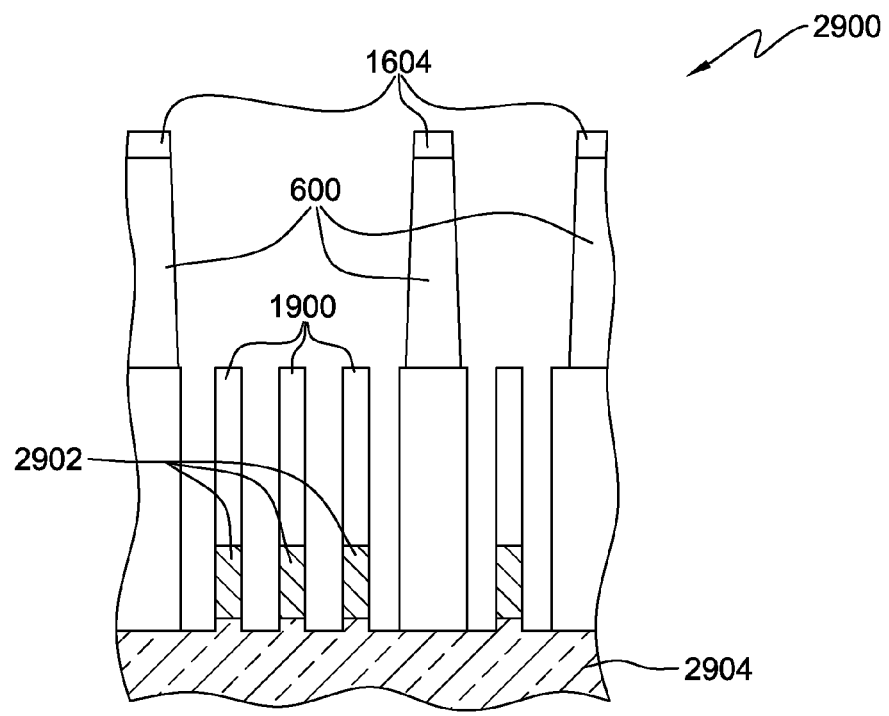
FIGS. 29A, 29B, & 30 depict structures found in semiconductor device structure fabrication, in accordance with one or more aspects of the present invention.
Figure 29B:
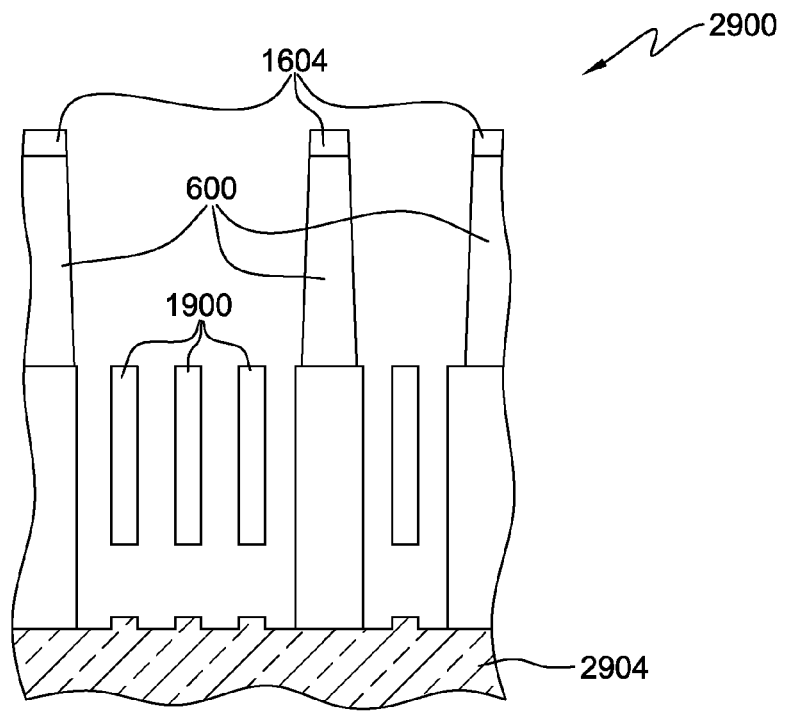
Figure 30:
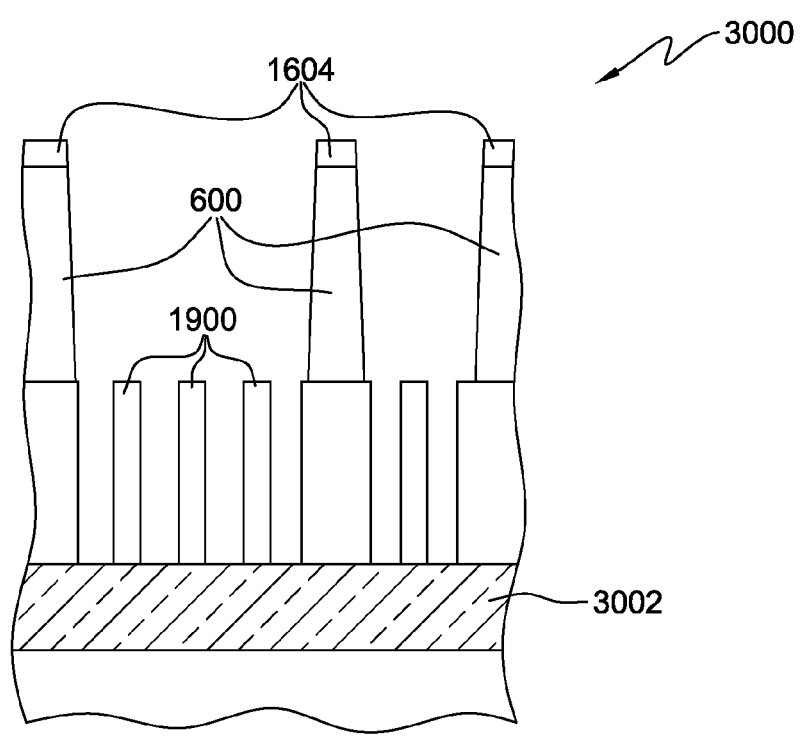

FIGS. 29A, 29B, & 30 depict various structures found in semiconductor device structure fabrication processing, in accordance with one or more aspects of the present invention. In the embodiment of FIG. 29A, structure 2900 includes isolation layer 2902, which is provided within lower portions of fin structures 1900, and isolation layer 2904, which is provided below fin structures 1900. FIG. 29B depicts structure 2900 after removing isolation layer 2902, in accordance with one or more aspects of the present invention. FIG. 30 depicts structure 3000 having isolation layer 3002 below fin structures 1900, in accordance with one or more aspects of the present invention. In one embodiment, isolation layer 2904 can be heavily counter doped and will not be turned on during device operation (e.g., of channels in fin structures 1900).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a semiconductor device structure having at least one fin structure, the fabricating comprising:
        providing a first mask above a substrate structure and a second mask above the first mask and the substrate structure;
        removing portions of the first mask not underlying the second mask and selectively etching the substrate structure using the second mask to form at least one cavity therein,
        forming a semiconductor region of the semiconductor device structure within the at least one cavity in the substrate structure;
        providing a third mask over portions of the substrate structure not underlying the second mask and removing the second mask; and
        after forming the semiconductor region within the at least one cavity, selectively etching the substrate structure using remaining portions of the first mask and the third mask to form the at least one fin structure of the semiconductor device structure, wherein the at least one fin structure is self-aligned with the at least one cavity in the substrate structure.

2. The method of claim 1, wherein providing the third mask comprises providing the third mask over the semiconductor region of the semiconductor device structure.

3. The method of claim 1, wherein one end of the at least one fin structure is aligned with an edge of the at least one cavity in the substrate structure.

4. The method of claim 1, further comprising:
    forming a contact structure of the semiconductor device structure at least partially surrounding the at least one fin structure.

5. The method of claim 1, further comprising:
    providing an isolation layer between the second mask and the first mask.

6. The method of claim 5, further comprising:
    providing a fourth mask coplanar with and adjacent to portions of the second mask; and selectively etching the substrate structure and the isolation layer using the remaining portions of the first mask, the third mask, and the fourth mask to form spacers concurrent with forming the at least one fin structure, wherein the spacers are self-aligned with the at least one cavity.

7. The method of claim 5, wherein forming the at least one fin structure comprises:
etching the isolation layer to form spacers above the at least one fin structure and adjacent to the at least one cavity.

8. The method of claim 5, further comprising:
providing a trench isolation material on at least one side of the at least one cavity, wherein the trench isolation material and the isolation layer comprise different materials having different etch properties.

9. The method of claim 1, further comprising:
providing the second mask with at least one rectangular segment and the first mask with multiple rectangular segments, wherein the multiple rectangular segments of the first mask are spaced apart and are substantially perpendicular to the at least one rectangular segment of the second mask.

10. The method of claim 1, wherein:
said substrate structure comprises a semiconductor layer over an isolation layer.

11. The method of claim 10, wherein providing the substrate structure with the isolation layer comprises modifying a material layer of the substrate structure to form the isolation layer thereof.

12. The method of claim 10, wherein providing the substrate structure with the isolation layer comprises implanting impurities within lower portions of the at least one fin structure.

13. The method of claim 10, wherein providing the substrate structure with the isolation layer comprises implanting impurities within the substrate structure and below the at least one fin structure.

14. The method of claim 10, wherein the method comprises providing the substrate structure with the isolation layer after forming the at least one fin structure.

15. The method of claim 1, further comprising:
separating upper portions of the at least one fin structure from the substrate structure to form at least one nanowire of the semiconductor device structure.

16. The method of claim 1, wherein the semiconductor device structure is a fin-type transistor, and the method further comprises:
forming at least one of a source region or a drain region of the fin-type transistor within the at least one cavity in the substrate structure, wherein the at least one source region or drain region of the fin-type transistor is self-aligned with the at least one fin structure thereof.

* * * * *